United States Patent
Kim et al.

(10) Patent No.: US 10,600,806 B2
(45) Date of Patent: Mar. 24, 2020

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Sung Gil Kim, Yongin-si (KR); Seul Ye Kim, Seoul (KR); Hong Suk Kim, Yongin-si (KR); Jin Tae Noh, Yongin-si (KR); Ji Hoon Choi, Seongnam-si (KR); Jae Young Ahn, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/459,337

(22) Filed: Jul. 1, 2019

(65) Prior Publication Data

US 2019/0326321 A1 Oct. 24, 2019

Related U.S. Application Data

(63) Continuation of application No. 15/871,059, filed on Jan. 14, 2018, now Pat. No. 10,340,284.

(30) Foreign Application Priority Data

Jul. 6, 2017 (KR) .................. 10-2017-0085703

(51) Int. Cl.
*H01L 27/11582* (2017.01)
*H01L 23/532* (2006.01)
(Continued)

(52) U.S. Cl.
CPC .. *H01L 27/11582* (2013.01); *H01L 23/53295* (2013.01); *H01L 24/29* (2013.01);
(Continued)

(58) Field of Classification Search
CPC . H01L 23/53295; H01L 24/29; H01L 25/065; H01L 27/10885; H01L 27/10888;
(Continued)

(56) References Cited

U.S. PATENT DOCUMENTS 8,669,608 B2 3/2014 Sato et al.
8,912,591 B2 12/2014 Baek et al.
(Continued)

OTHER PUBLICATIONS

Search Report and Written Opinion for Singapore Application No. 10201803196Y, dated Jul. 31, 2018.

*Primary Examiner* — Allan R Wilson
(74) *Attorney, Agent, or Firm* — Renaissance IP Law Group LLP

(57) ABSTRACT

A stack structure includes conductive layer patterns and interlayer insulating layer patterns alternately stacked on one another. A channel hole penetrates the stack structure. A dielectric layer is disposed on a sidewall of the channel hole. A channel layer is disposed on the dielectric layer and in the channel hole. A passivation layer is disposed on the channel layer and in the channel hole. The channel layer is interposed between the passivation layer and the dielectric layer. An air gap is surrounded by the passivation layer. A width of the air gap is larger than a width of the passivation layer.

14 Claims, 29 Drawing Sheets

(51) Int. Cl.
  *H01L 27/108* (2006.01)
  *H01L 23/00* (2006.01)
  *H01L 29/06* (2006.01)
  *H01L 25/065* (2006.01)
  *H01L 27/11565* (2017.01)

(52) U.S. Cl.
  CPC ...... *H01L 25/065* (2013.01); *H01L 27/10885* (2013.01); *H01L 27/10888* (2013.01); *H01L 27/11565* (2013.01); *H01L 29/0649* (2013.01); *H01L 2924/1434* (2013.01); *H01L 2924/1436* (2013.01); *H01L 2924/14511* (2013.01)

(58) Field of Classification Search
  CPC ......... H01L 27/11551; H01L 27/11565; H01L 27/11582; H01L 29/0649
  See application file for complete search history.

(56) References Cited

U.S. PATENT DOCUMENTS

| | | | |
|---|---|---|---|
| 9,177,966 B1 | 11/2015 | Rabkin et al. | |
| 9,305,938 B2 | 4/2016 | Simsek-Ege et al. | |
| 9,443,865 B2 | 9/2016 | Rabkin et al. | |
| 9,484,353 B1 | 11/2016 | Lai et al. | |
| 9,515,085 B2 | 12/2016 | Rabkin et al. | |
| 9,613,981 B2 | 4/2017 | Huo et al. | |
| 9,679,913 B1 | 6/2017 | Hu et al. | |
| 9,972,639 B2 | 5/2018 | Song et al. | |
| 2011/0115010 A1 | 5/2011 | Shim et al. | |
| 2013/0134492 A1* | 5/2013 | Yang | H01L 27/1157 257/314 |
| 2014/0112049 A1* | 4/2014 | Jung | H01L 29/66833 365/72 |
| 2015/0137210 A1 | 5/2015 | Nam et al. | |
| 2015/0194435 A1 | 7/2015 | Lee | |
| 2015/0294980 A1 | 10/2015 | Lee et al. | |
| 2015/0303214 A1 | 10/2015 | Kim et al. | |
| 2016/0005747 A1 | 1/2016 | Lee et al. | |
| 2016/0204115 A1 | 7/2016 | Ko et al. | |
| 2016/0260733 A1 | 9/2016 | Lue | |
| 2016/0336340 A1 | 11/2016 | Song et al. | |
| 2017/0012051 A1 | 1/2017 | Lee et al. | |
| 2017/0025428 A1 | 1/2017 | Lai et al. | |
| 2017/0194340 A1 | 7/2017 | Lue | |
| 2018/0033799 A1 | 2/2018 | Kanamori et al. | |
| 2018/0175053 A1* | 6/2018 | Park | H01L 27/11582 |
| 2018/0182776 A1* | 6/2018 | Kim | H01L 27/11582 |
| 2018/0197794 A1* | 7/2018 | Kang | B82Y 10/00 |
| 2018/0211969 A1 | 7/2018 | Lue | |

\* cited by examiner

SEMICONDUCTOR DEVICE AND METHOD FOR FABRICATING THE SAME

This application is a continuation of U.S. patent application Ser. No. 15/871,059, filed on Jan. 14, 2018, which claims priority under 35 U.S.C. § 119 to Korean Patent Application No. 10-2017-0085703 filed on Jul. 6, 2017, in the Korean Intellectual Property Office, the disclosure of which is incorporated by reference herein in its entirety.

TECHNICAL FIELD

The present inventive concept relates to a semiconductor device and a method for fabricating the same.

DISCUSSION OF RELATED ART

Semiconductor memory devices are memory devices implemented using a semiconductor such as silicon (Si), germanium (Ge), gallium arsenide (GaAs) and indium phosphide (InP). Semiconductor memory devices are largely classified into volatile memory devices and non-volatile memory devices. A volatile memory device loses stored data when the power supply is interrupted. Volatile memory devices include static RAM (SRAM), dynamic RAM (DRAM), synchronous DRAM (SDRAM), and the like. A non-volatile memory device retains stored data even if the power supply is interrupted. Non-volatile memory devices include a flash memory device, a read only memory (ROM), a programmable ROM (PROM), an electrically programmable ROM (EPROM), an electrically erasable and programmable ROM (EEPROM), a resistive memory device, e.g., a phase-change RAM (PRAM), a ferroelectric RAM (FRAM), a resistive RAM (RRAM) and the like.

SUMMARY

According to an exemplary embodiment of the present inventive concept, a semiconductor device is provided as follows. A stack structure includes a plurality of conductive layer patterns and a plurality of interlayer insulating layer patterns that are alternately stacked on one another. A channel hole penetrates the stack structure. A dielectric layer is disposed on a sidewall of the channel hole. A channel layer is disposed on the dielectric layer and in the channel hole. A passivation layer is disposed on the channel layer and in the channel hole. The channel layer is interposed between the passivation layer and the dielectric layer. An air gap is surrounded by the passivation layer. A width of the air gap is larger than a width of the passivation layer.

According to an exemplary embodiment of the present inventive concept, a semiconductor device is provided as follows. A stack structure includes a plurality of conductive layer patterns and a plurality of interlayer insulating layer patterns that are alternately and vertically stacked on one another. An air gap is disposed vertically in the stack structure. A passivation layer covers an upper surface of the air gap. A channel layer surrounds a side surface of the air gap. A dielectric layer surrounding a side surface of the channel layer is in contact with the stack structure. A pad that is disposed on the passivation layer is in contact with an uppermost interlayer insulating layer pattern of the interlayer insulating layer patterns.

According to an exemplary embodiment of the present inventive concept, a semiconductor device is provided as follows. A vertical channel includes an air gap, a channel layer surrounding a side surface of the air gap, a dielectric layer surrounding a side surface of the channel layer, a passivation layer covering an upper surface of the air gap, and a pad disposed on the passivation layer. A plurality of interlayer insulating layer patterns surround a side surface of the vertical channel The interlayer insulating layer patterns are vertically spaced apart from one another. A plurality of conductive layer patterns surround the side surface of the vertical channel and each of the plurality of conductive layer patterns is disposed between two adjacent interlayer insulating layer patterns of the interlayer insulating layer patterns. The passivation layer includes a horizontal layer that is in contact with the air gap and has a first width, and a protrusion that extends from the horizontal layer into the pad and has a second width smaller than the first width. A height of an upper surface of the protrusion is lower than an upper surface of the pad.

According to an exemplary embodiment of the present inventive concept, a method of fabricating a semiconductor device is provided as follows. A molded structure is formed by alternately stacking a plurality of interlayer insulating layers and a plurality of sacrificial layers on a substrate. A vertical channel having an air gap is formed in the molded structure. The vertical channel penetrates the molded structure.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
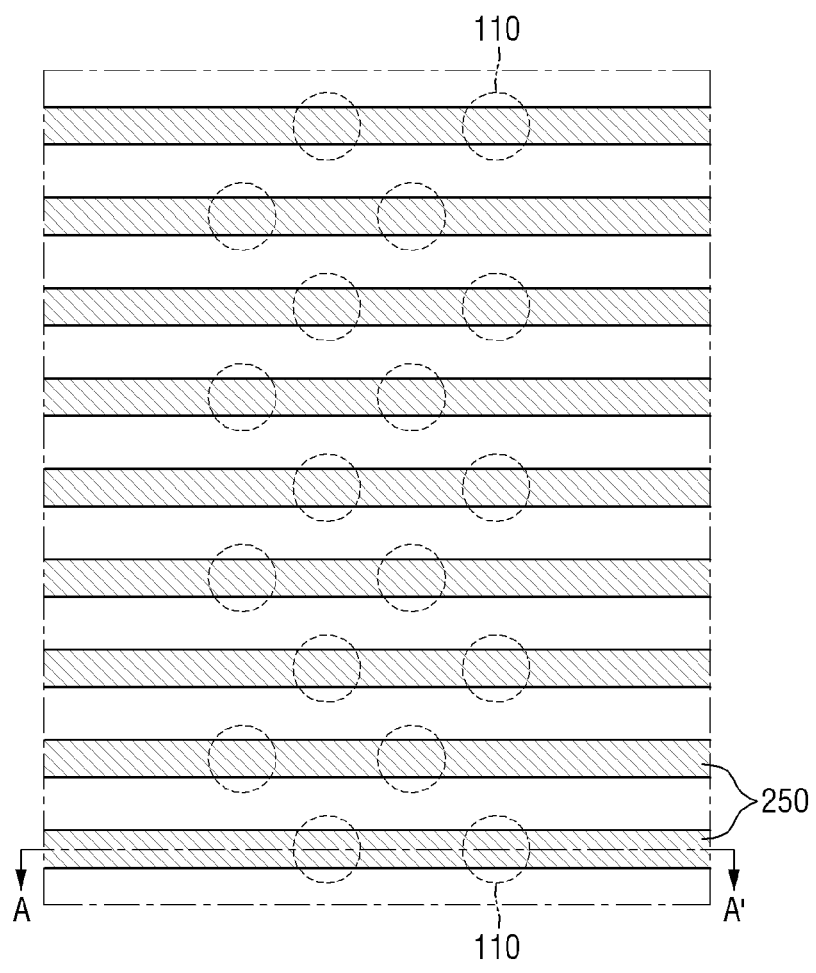
FIG. 1 is a plan view for illustrating a semiconductor device according to some exemplary embodiments of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings. Hereinafter, a semiconductor device according to some exemplary embodiments of the present disclosure will be described with reference to FIGS. 1 to 5.

Figure 2:
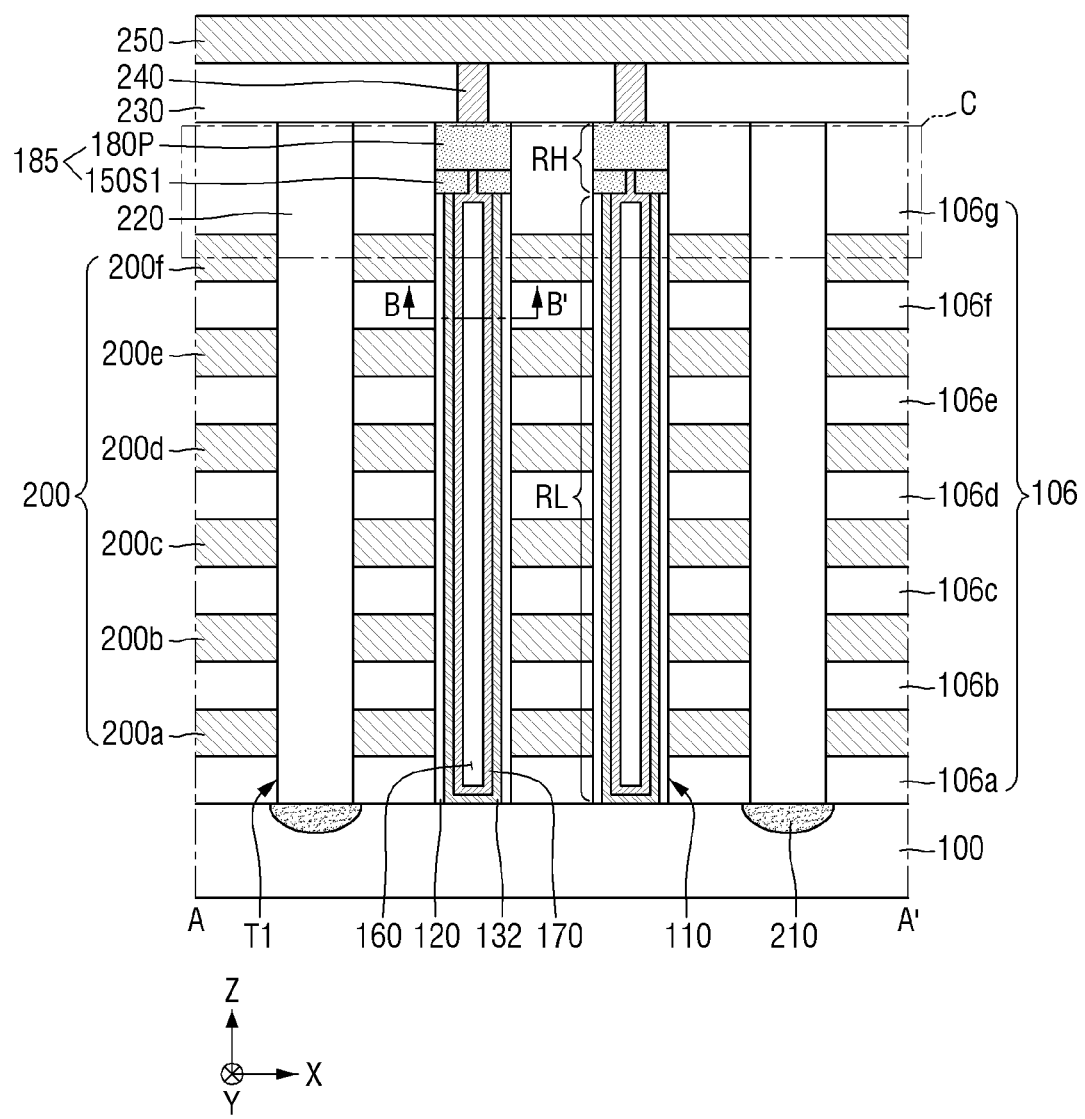
FIG. 2 is a cross-sectional view taken along line A-A' of FIG. 1.
Figure 3:
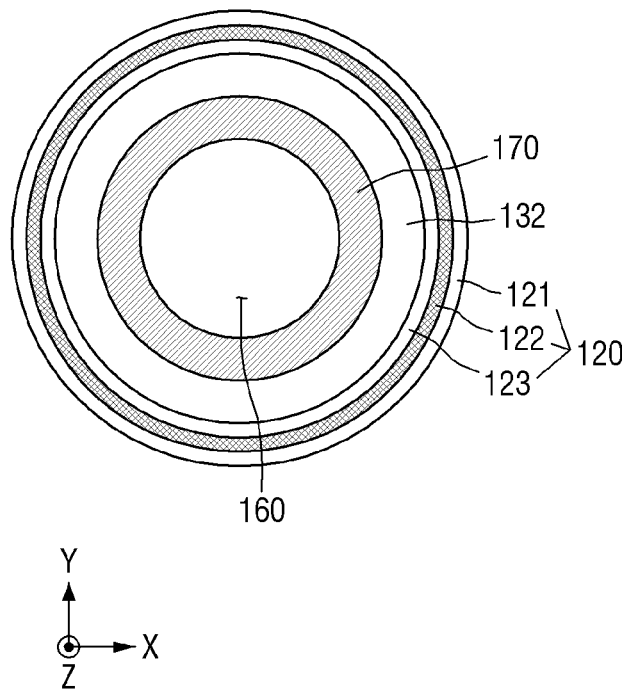
FIG. 3 is a cross-sectional view taken along line B-B' of FIG. 2.
Figure 4:
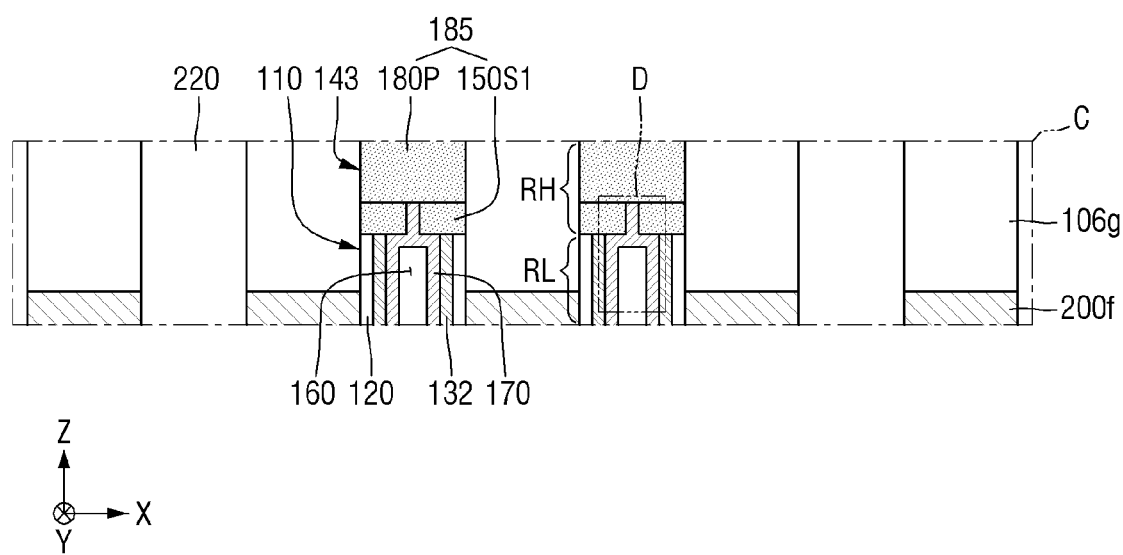
FIG. 4 is an enlarged cross-sectional view of portion C of FIG. 2.
Figure 5:
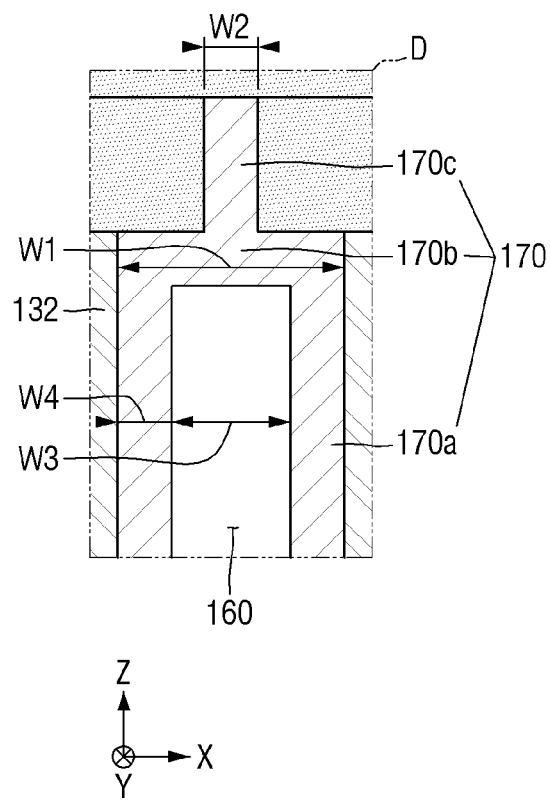
FIG. 5 is a view for illustrating a passivation layer of FIG. 4.

FIG. 1 is a plan view for illustrating a semiconductor device according to some exemplary embodiments of the present inventive concept. FIG. 2 is a cross-sectional view taken along line A-A' of FIG. 1. FIG. 3 is a cross-sectional view taken along line B-B' of FIG. 2. FIG. 4 is an enlarged cross-sectional view of portion C of FIG. 2. FIG. 5 is a view for illustrating a passivation layer of FIG. 4.

Referring to FIGS. 1 and 5, a semiconductor device according to some exemplary embodiments of the present inventive concept may include a substrate 100, a plurality of interlayer insulating layer patterns 106, a plurality of conductive layer patterns 200, a dielectric layer 120, a channel layer 132, a passivation layer 170, an air gap 160, a pad 185, a common source region 210, a buried layer 220, an upper insulating layer 230, a conductive contact 240 and a bit line 250.

Referring to FIG. 1, the bit line 250 may extend in a first direction X. More than one bit lines 250 may be disposed, such that they may be spaced apart from one another in a second direction Y. The second direction Y may intersect the first direction X.

The first direction X may be perpendicular to the second direction Y. However, it is merely illustrative.

A third direction Z may intersect the first direction X and the second direction Y. For example, the third direction Z may be perpendicular to the first direction X and the second direction Y. However, the present inventive concept is not limited thereto.

The bit line 250 may overlap a channel hole 110 in the third direction Z. The third direction Z may be the vertical direction. For example, the bit line 250 may be disposed above the channel hole 110 so that the bit line 250 overlaps with the channel hole 110 in the third direction Z.

The channel hole 110 may be arranged in plural. For example, two channel holes may be aligned in the first direction X. In the second direction Y, the channel hole 110 in plural may be arranged in a zigzag pattern. A channel hole adjacent to another channel hole in the second direction Y may be staggered with each other in the second direction Y. Every other channel holes may be aligned with one another in the second direction Y. In this manner, the density of the channel holes may be increased. However, the present inventive concept is not limited thereto.

Referring to FIG. 2, the substrate 100 may be, for example, a bulk silicon substrate or a silicon-on-insulator (SOI) substrate. Alternatively, the substrate 100 may be a silicon substrate or may be a substrate made of other materials, such as silicon germanium (SiGe), indium antimonide (InSb), lead-telluride (PbTe) compound, indium arsenide (InAs), indium phosphide (InP), gallium arsenide (GaAs) and gallium antimonide (GaSb). Alternatively, the substrate 100 may be formed by growing an epitaxial layer on a base substrate.

The interlayer insulating layer patterns 106 and the conductive layer patterns 200 may be alternately stacked on the substrate 100. The interlayer insulating layer patterns 106 and the conductive layer patterns 200 may form a stack structure.

The interlayer insulating layer patterns 106 may be formed of more than one layer. For example, the interlayer insulating layer patterns 106 may seven interlayer insulating layer patterns, which are indicated as 106a to 106g. The present inventive concept is not limited thereto.

The interlayer insulating layer patterns 106 may be a silicon oxide layer, a silicon nitride layer or a silicon oxynitride layer. However, the present inventive concept is not limited thereto. Each of the interlayer insulating layer patterns 106 may be disposed between two conductors to prevent electrical connection therebetween.

In the semiconductor device according to the exemplary embodiment of the present inventive concept, the interlayer insulating layer patterns 106 may include a low-k dielectric material. The low-k dielectric material may refer to an insulating material having a lower dielectric constant than that of silicon oxide.

The conductive layer patterns 200 may be formed of more than one layer. For example, the conductive layer patterns 200 may include six conductive layer patterns, which are indicated as 200a to 200f. The present inventive concept is not limited thereto.

The conductive layer patterns 200 may include conductor. The conductive layer patterns 200 may serve as a word line or a gate electrode of the semiconductor device according to the exemplary embodiment of the present inventive concept. Although not shown in the drawings, the conductive layer patterns 200 may include multiple layers other than a single layer.

Alternatively, a gate insulating layer may be further included between each of the pairs of the conductive layer patterns 200 and the interlayer insulating layer patterns 106. The gate insulating layer may be, but is not limited to, a silicon oxide layer.

The conductive layer patterns 200 may include, for example, a metal. The conductive layer patterns 200 may include, for example, tungsten (W). However, the present inventive concept is not limited thereto.

Device isolation of the interlayer insulating layer patterns 106 and the conductive layer patterns 200 may be made by a trench T1. For example, the trench T1 may extend in the second direction Y to isolate a stack structure of the interlayer insulating layer patterns 106 and the conductive layer patterns 200 from another stack structure. For example, the trench T1 may penetrate the stack structure of the interlayer insulating layer patterns 106 and the conductive layer patterns 200 in the third direction Z. An uppermost interlayer insulating layer pattern 106g may be disposed at the top of the stack structure of the interlayer insulating layer patterns 106 and the conductive layer patterns 200, and a lowermost interlayer insulating layer pattern 106a may be disposed at the bottom of the stack structure. However, the present inventive concept is not limited thereto.

The uppermost interlayer insulating layer pattern 106g disposed at the top of the interlayer insulating layer patterns 106 may be formed thicker than other interlayer insulating layer patterns indicated as 106a to 106f. This may be to provide a margin for forming the pad 185.

The trench T1 may expose the side surfaces of the interlayer insulating layer patterns 106, the side surfaces of the conductive layer patterns 200 and the upper surface of the substrate 100.

A common source region 210 may be formed at the portion of the substrate 100 exposed via the trench T1. The common source region 210 may be formed using, for example, a doping process. The common source region 210 may be formed in the substrate 100.

The common source region 210 may be extended in the direction that the above-described trench T1 is extended, i.e., the second direction Y and may be used as a common source line (CSL). According to some exemplary embodiments of the present inventive concept, a metal silicide pattern, such as a nickel silicide pattern and a cobalt silicide pattern, may be further formed on the common source region 210 to reduce the resistance between the common source region 210 and a conductive element to be electrically connected to the common source region 210, for example, a CSL contact.

The trench T1 may be filled with buried layer 220. Accordingly, the buried layer 220 may be formed on the upper surface of the common source region 210 exposed through the trench T1. The buried layer 220 may have a top surface that is positioned at the same height as the top surface of the uppermost interlayer insulating layer pattern 106g at the top of the interlayer insulating layer patterns 106 to completely fill the trench T1.

The channel hole 110 may be formed in the stack structure in which the interlayer insulating layer patterns 106 and the conductive layer patterns 200 are alternately stacked. For example, the channel hole 110 penetrating the stack structure may be formed. The channel hole 110 may penetrate the stack structure to expose the upper surface of the substrate 100. The channel hole 110 may include a low region RL and a high region RH. In the low region RL, the dielectric layer 120, the channel layer 132, the air gap 160 and the passivation layer 170 are formed to constitute a vertical channel In the high region RH, the pad 185 is formed. In an exemplary embodiment, the conductive layer patterns 200 may surround a side surface of the vertical channel. Each of the conductive layer patterns 200 may be formed between two adjacent interlayer insulating layer patterns of the interlayer insulating layer patterns 106.

The low region RL of the channel hole 110 is defined by the side surfaces of the interlayer insulating layer patterns 106 and the side surfaces of the conductive layer patterns 200. On the other hand, the high region RH of the channel hole 110 may be in contact with the uppermost interlayer insulating layer pattern 106g disposed at the top and need not be in contact with the rest of the interlayer insulating layer patterns 106.

Referring to FIGS. 2 to 5, the dielectric layer 120 may be formed on the sidewall of the low region RL of the channel hole 110. The dielectric layer 120 may be formed along the inner side wall of the channel hole 110. Accordingly, the space inside the inner side wall of the dielectric layer 120 may be defined. That is, the dielectric layer 120 may have a straw shape, i.e., a hollow cylindrical shape.

The dielectric layer 120 may include a tunnel insulating layer 123, a charge trap layer 122, and a blocking insulating layer 121. In the semiconductor device according to some embodiments of the present inventive concept, the blocking insulating layer 121 may be formed between the interlayer insulating layer patterns 106 and the conductive layer patterns 200 depending on the process order, instead of being formed in the channel hole 110.

The blocking insulating layer 121 may be formed along the inner side walls of the channel hole 110. The blocking insulating layer 121 may be formed using an oxide such as silicon oxide.

The charge trap layer 122 may be disposed between the tunnel insulating layer 123 and the blocking insulating layer 131. The charge trap layer 122 stores charges having passed through the tunnel insulating layer 123.

For example, the charge trap layer 122 may be formed of a nitride layer or a high-k dielectric layer. For example, the nitride layer may include at least one of: silicon nitride, silicon oxynitride, hafnium oxynitride, zirconium oxynitride, hafnium silicon oxynitride, and hafnium aluminum oxynitride.

For example, the high-k dielectric layer may include at least one of: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

The tunnel insulating layer 123 may pass charges between the channel layer 132 and the charge trap layer 122. For example, the tunnel insulating layer 123 may be formed of a silicon oxide layer, or a double layer of a silicon oxide layer and a silicon nitride layer. The tunnel insulating layer 123 may include an insulating material having a dielectric constant lower than that of the blocking insulating layer 121.

The dielectric layer 120 may be formed to have an oxide-nitride-oxide (ONO) structure in which an oxide layer, a nitride layer and an oxide layer are sequentially stacked. The tunnel insulating layer 123, the charge trap layer 122, and the blocking insulating layer 121 may be formed via a chemical vapor deposition (CVD) process, a plasma enhanced CVD (PECVD) process, an atomic layer deposition (ALD) process, or the like. However, the present inventive concept is not limited thereto.

The channel layer 132 may be formed along the upper surface of the dielectric layer 120 that is extended along the third direction Z. The channel layer 132 may be formed on the sidewall of the low region RL of the channel hole 110. The channel layer 132 may also be formed along the upper surface of the substrate 100 exposed in the channel hole 110. For example, the channel layer 132 may have a cup shape covering the side wall and the bottom surface of the channel hole 110.

The channel layer 132 is a thin layer to the extent that the channel hole 110 need not be completely filled. Therefore, an empty space may exist inside the channel hole 110 with the channel layer 132.

The passivation layer 170 may be formed in the low region RL and the high region RH of the channel hole 110. In the low region RL of the channel hole 110, the passivation layer 170 may be formed along the upper surface of the channel layer 132. The passivation layer 170 may cover the sidewall of the channel hole 110 and the upper surface of the substrate 100 like the channel layer 132 formed along the sidewall of the channel hole 110 and the upper surface of the substrate 100.

The passivation layer 170 may also cover the upper surface of the low region RL of the channel hole 110. For example, the channel hole 110 may be divided into the low region RL and the high region RH by the passivation layer 170. Therefore, in the low region RL of the channel hole 110, the passivation layer 170 may have a hollow and closed cylindrical shape.

The passivation layer 170 may protect the interface of the channel layer 132 from defects. With the passivation layer 170, defects on the surface of the channel layer 132 may be reduced, and damage during subsequent processes may also be reduced.

The passivation layer 170 may include an insulator. The passivation layer 170 may include at least one of, for example, SiO2, SiON, SiN and a high-k dielectric material. The high-k dielectric material may include at least one of AlO, AlON, and HfO, for example.

An air gap 160 may be defined surrounded by the passivation layer 170 in all directions. The air gap 160 may be formed in the low region RL of the channel hole 110.

The pad 185 and a part of the passivation layer 170 may be formed in the high region RH of the channel hole 110.

Referring to FIG. 5, the passivation layer 170 may include a lower layer 170a, a horizontal layer 170b, and a protrusion 170c. The lower layer 170a of the passivation layer 170 may be formed in the low region RL of the channel hole 110. The lower layer 170a may be formed on the inner side surface and the bottom surface of the channel layer 132 to surround the inner wall of the channel hole 110.

The horizontal layer 170b may cover the upper surface of the low region RL of the channel layer 132. The horizontal layer 170b may be connected to the lower layer 170a to define the air gap 160 therein. For example, a portion of the lower surface of the horizontal layer 170b that is not in contact with the lower layer 170a may be in contact with the air gap 160.

The upper surface and the lower surface of the horizontal layer 170b may be flat. As used herein, the term "flat surface" is intended to encompass a surface that is flat over a majority of its surface area despite small features resulted from processing factors.

The protrusion 170c may protrude in the third direction Z from the upper surface of the horizontal layer 170b. The protrusion 170c may be the only part of the passivation layer 170 located in the high region RH of the channel hole 110. The protrusion 170c may project upwardly from the center of the horizontal layer 170b.

The horizontal layer 170b may completely separate the channel hole 110 into the high region RH and the low region RL and have a first width W1 in the first direction X. The first width W1 may be equal to the distance between the inner walls of the channel layer 132 in the channel hole 110. If the horizontal cross section of the channel hole 110 is circular, the width of the second direction Y may also be the first width W1.

The protrusion 170c may have a second width W2 smaller than the first width W1 in the first direction X on the horizontal layer 170b. The air gap 160 may have a third width W3 in the first direction X. The third width W3 may be equal to the distance between the inner walls of the lower layer 170a of the passivation layer 170. When the channel hole 110 has a horizontal cross section, the width of the air gap 160 in the second direction Y may be equal to the third width W3. The third width W3 of the air gap 160 may be greater than the second width W2 of the protrusion 170c. In addition, the position of the protrusion 170c may overlap the air gap 160 in the third direction Z. For example, the protrusion 170c may be located at the center of the horizontal cross section so that the protrusion 170c is not in contact with the side wall of the channel hole 110.

The lower layer 170a of the passivation layer 170 may have a fourth width W4. The fourth width W4 may be smaller than the first width W1. In addition, the fourth width W4 may be smaller than the third width W3. The third width W3 may be not only larger than the fourth width W4 but also larger than twice the fourth width W4. For example, the air gap 160 may occupy most of the volume of the channel hole 110, while the passivation layer 170 may be so thin that it is only coated on the surface of the channel hole 110.

Referring to FIG. 4, the pad 185 may include a first pad 150S1 and a second pad 180P.

The first pad 150S1 may be in contact with the side surface of the protrusion 170c and the inner wall of the high region RH of the channel hole 110. The upper surface of the first pad 150S1 may be positioned at the same height with the upper surface of the protrusion 170c. The lower surface of the first pad 150S1 may be in contact with the upper surface of the dielectric layer 120, the channel layer 132 and the passivation layer 170. For example, the upper surface of the dielectric layer 120, the upper surface of the channel layer 132 and the upper surface of the horizontal layer of the passivation layer 170 may all be positioned at the same height. The upper surface of the first pad 150S1, the upper surface of the protrusion 170c and the side wall of the channel hole 110 may define a first recess 143. In other words, the first recess 143 may be surrounded by the sidewall of the channel hole 110, the upper surface of the protrusion 170c, and the upper surface of the first pad 150S1. The first recess 143 may be filled with the second pad 180P. The second pad 180P may be formed on the first pad 150S1. The second pad 180P may be formed on the protrusion 170c. The first pad 150S1 and the second pad 180P may include the same material. Therefore, the interface between the first pad 150S1 and the second pad 180P need not be clearly recognized in the vertical cross section. Accordingly, the pad 185 including the first pad 150S1 and the second pad 180P may be formed as a single element. However, the present inventive concept is not limited thereto.

The pad 185 may work as a drain node in the semiconductor device according to some exemplary embodiments of the present inventive concept. To this end, the pad 185 may be a region doped with impurities. Carriers may move in the semiconductor device in the order of the common source region 210, the channel layer 132, the pad 185 and the bit line 250. The upper insulating layer 230 may be formed on the stack structure in which the interlayer insulating layer patterns 106 and the conductive layer patterns 200 are alternately stacked. The upper insulating layer 230 may be formed on the buried layer 220 and the pad 185. For example, the upper surface of the uppermost interlayer insulating layer pattern 106g at the top of the stack structure, the upper surface of the buried layer 220 and the upper surface of the pad 185 may have the same plane, and the upper insulating layer 230 may be formed thereon. The upper insulating layer 230 may include an insulating material such as silicon oxide. However, the present inventive concept is not limited thereto. The conductive contact 240 may penetrate the upper insulating layer 230. The conductive contact 240 may be formed on the upper surface of the pad 185. For example, the conductive contact 240 may be in contact with the pad 185 and electrically connected to the pad 185. The conductive contact 240 may be in contact with and electrically connected to the bottom surface of the bit line 250. The conductive contact 240 may include a conductor. For example, the conductive contact 240 may include at least one of a metal, a metal nitride, a metal silicide, and doped polysilicon. However, the present inventive concept is not limited thereto.

The bit line 250 may extend in the first direction X on the upper insulating layer 230 and the conductive contact 240. The bit line 250 may be in contact with and electrically connected to the conductive contact 240.

The semiconductor device according to some exemplary embodiments of the present inventive concept may include the air gap 160 in the channel hole 110. In a typical vertical channel semiconductor structure, an oxide layer that is in contact with the channel layer 132 in the channel hole 110 may fully fill the channel hole 110 to form a filling layer. Since the channel layer 132 includes polycrystalline silicon in which a number of crystals exist, that is, polysilicon, there may be defects on the interface with the oxide layer. Such defects on the interface may cause the threshold voltage of the semiconductor device to be non-uniform. To solve this problem, it has been proposed to adjust the thickness of the channel layer 132 to reduce defects on the interface. The reliability of the semiconductor device may be increased. As the aspect ratio of the vertical channel increases and the scale of the entire semiconductor device becomes smaller, it becomes more and more difficult to adjust the thickness. In view of the above, according to the exemplary embodiment of the present inventive concept, the filling layer is eliminated in the first place, and thus charge trap resulted from defects on interface may be suppressed. Further, since the filling layer has a higher dielectric constant than that of the air, it may create parasitic capacitance with another adjacent element. In contrast, in the semiconductor device according to the exemplary embodiment of the present inventive concept, the dielectric constant near the channel layer 132 becomes very low by the air gap 160, such that it is possible to suppress parasitic capacitance.

In addition, in a typical semiconductor device having a vertical channel, the filling layer is an oxide layer that applies compressive stress to the channel layer 132. Since the channel layer 132 includes polycrystalline silicon, there may be defects on the interfaces between the grains of the poly-crystal due to the compressive stress, and charges may be trapped there, which may cause a charge loss.

In contrast, in the semiconductor device according to some exemplary embodiments of the present inventive concept, the air gap 160 is formed instead of the filling layer, so that the compressive stress applied to the channel layer 132 may be removed. Accordingly, defects between the grains inside the channel layer 132 may also be reduced.

Accordingly, the semiconductor device according to some exemplary embodiments of the present inventive concept may prevent channel swing, current leakage, and reliability degradation caused by the charge trap, thereby increasing the operation performance.

Hereinafter, a semiconductor device according to some exemplary embodiments of the present inventive concept will be described with reference to FIG. 6. Descriptions of the identical elements described above will not be made to avoid redundancy.

Figure 6:
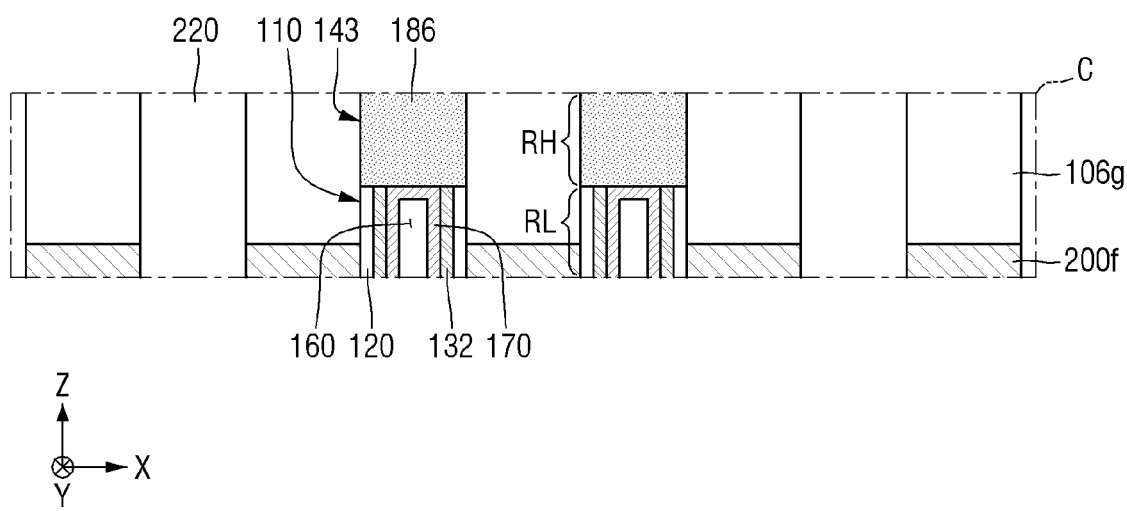
FIG. 6 is an enlarged cross-sectional view for illustrating a semiconductor device according to some exemplary embodiments of the present inventive concept.

FIG. 6 is an enlarged cross-sectional view for illustrating a semiconductor device according to some exemplary embodiments of the present inventive concept.

Referring to FIG. 6, the passivation layer 170 of the semiconductor device according to some exemplary embodiments of the present inventive concept need not include the protrusion 170c of FIG. 4. Therefore, the passivation layer 170 may include the horizontal layer 170b and the lower layer 170a of FIG. 5, and need not be formed in the high region RH of the channel hole 110.

A pad 186 may be formed as a single element, unlike the above-described embodiment. For example, the pad 186 may be the only single element that fills the first recess 143. However, the present inventive concept is not limited thereto.

The pad 186 may be in contact with the upper surfaces of the dielectric layer 120, the channel layer 132, and the passivation layer 170. For example, the lower surface of the pad 186 may be in contact with the upper surface of the dielectric layer 120, the upper surface of the channel layer 132, and the upper surface of the passivation layer 170.

As the passivation layer 170 has no protrusion, the area of the lower portion of the pad 186 that is in contact with the channel layer 132 may increase. Accordingly, the resistance between the channel layer 132 and the pad 186 may be reduced and thus the current flowing through the pad 186 may increase.

By doing so, the semiconductor device according to this exemplary embodiment may exhibit higher reliability and higher performance.

Hereinafter, a semiconductor device according to some exemplary embodiments of the present inventive concept will be described with reference to FIG. 7. Descriptions of the identical elements described above will not be made to avoid redundancy.

Figure 7:
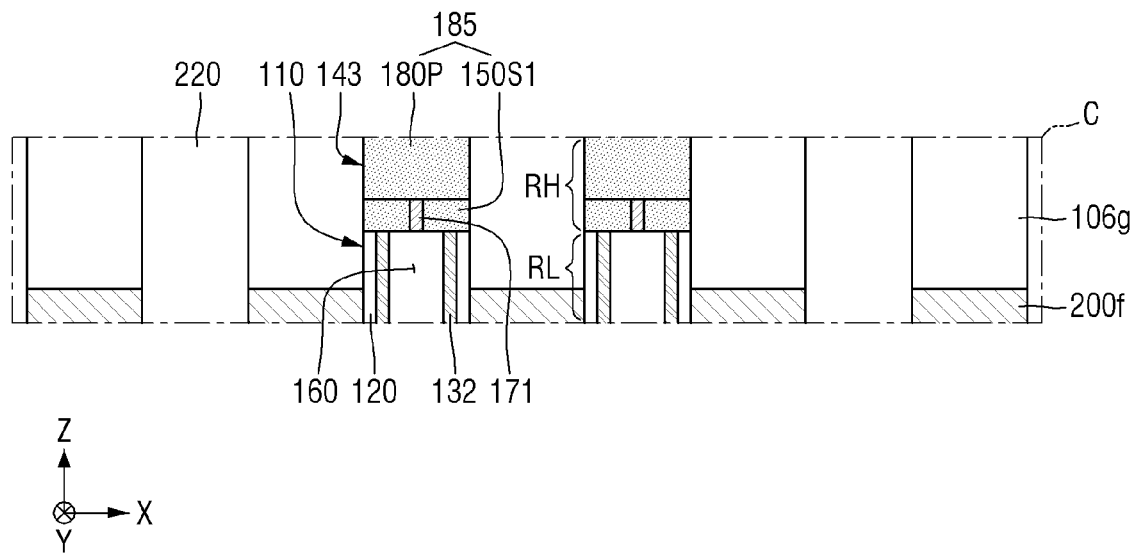
FIG. 7 is an enlarged cross-sectional view for illustrating a semiconductor device according to some exemplary embodiments of the present inventive concept.

FIG. 7 is an enlarged view for illustrating a semiconductor device according to some exemplary embodiments of the present inventive concept.

Referring to FIG. 7, in the semiconductor device according to some exemplary embodiments of the present inventive concept, a passivation layer 171 need not be formed in the low region RL but formed only in the high region RH of the channel hole 110.

For example, the horizontal layer 170b and the lower layer 170a of the passivation layer 170 of FIG. 5 need not be formed in this embodiment and only the protrusion 170c of FIG. 5 may be formed. Thus, the air gap 160 may be in contact with the channel layer 132. In addition, the pad 185 may be in direct contact with the air gap 160. For example, the lower surface of the first pad 150S1 may be in contact with the air gap 160.

In the semiconductor device according to some exemplary embodiments of the present inventive concept, no passivation layer is formed in the low region RL of the channel hole 110, such that the width of the air gap 160 in the horizontal direction, i.e., in the first direction X and the second direction Y may increase. Therefore, as the volume of the air gap 160 increases, the parasitic capacitance between the adjacent elements may be reduced.

In addition, since no compressive stress is applied to the channel layer 132 by the passivation layer 171, defects between the grains inside the channel layer 132 of polysilicon may be reduced.

Accordingly, in the semiconductor device according to some exemplary embodiments of the present inventive concept, charges trapped inside the channel layer 132 may be reduced, such that the parasitic capacitance may be reduced, thereby achieving better operation performance.

Hereinafter, a semiconductor device according to some exemplary embodiments of the present inventive concept will be described with reference to FIG. 8. Descriptions of the identical elements described above will not be made to avoid redundancy.

Figure 8:
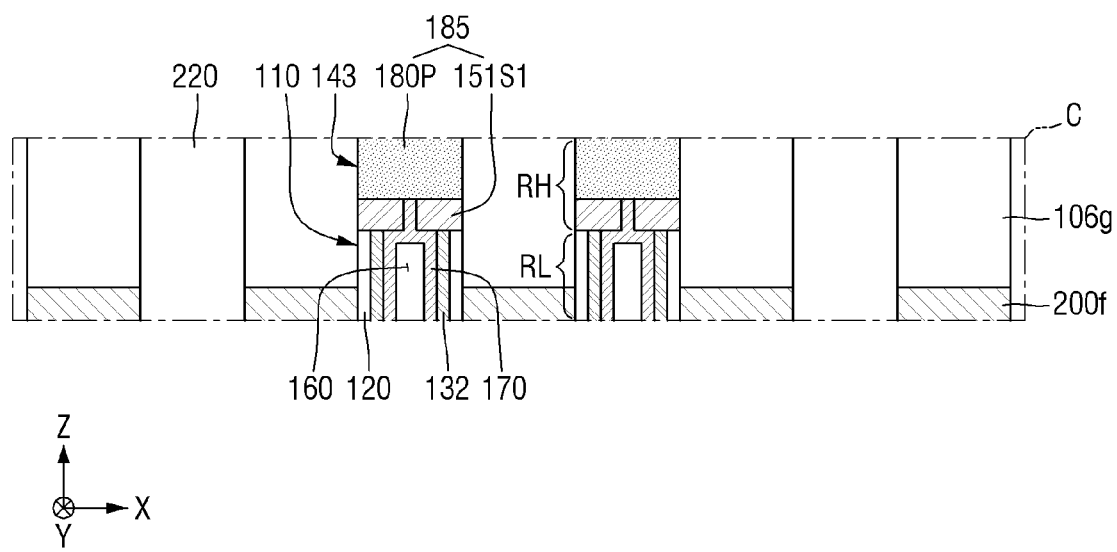
FIG. 8 is an enlarged cross-sectional view for illustrating a semiconductor device according to some exemplary embodiments of the present inventive concept.

FIG. 8 is an enlarged view for illustrating a semiconductor device according to some exemplary embodiments of the present inventive concept.

Referring to FIG. 8, a pad 185 of the semiconductor device according to some exemplary embodiments of the present inventive concept may include different materials.

For example, the pad 185 may include the second pad 180P of FIG. 4 and a first pad 151S1. The second pad 180P may be formed by doping polysilicon with impurities. On the other hand, the first pad 151S1 may include at least one of, for example, a metal and a metal silicide. However, the present inventive concept is not limited thereto.

The first pad 151S1 may be in contact with the channel layer 132. Accordingly, the material of the first pad 151S1 may lower the resistance between the pad 185 and the channel layer 132. Therefore, the resistance between the second pad 180P and the channel layer 132 may be reduced by selecting a material having a small resistance as the material of the first pad 151S1.

Alternatively, by adding a stress-resistant material to the first pad 151S1, unlike the second pad 180P, it is possible to enhance the durability of the vertical semiconductor structure.

As a result, the semiconductor device according to this exemplary embodiment of the present inventive concept may improve the operation speed and performance.

Hereinafter, a method for fabricating a semiconductor device according to some exemplary embodiments of the present inventive concept will be described with reference to FIGS. 9 to 31. Descriptions of the identical elements described above will not be made to avoid redundancy.

Figure 10:
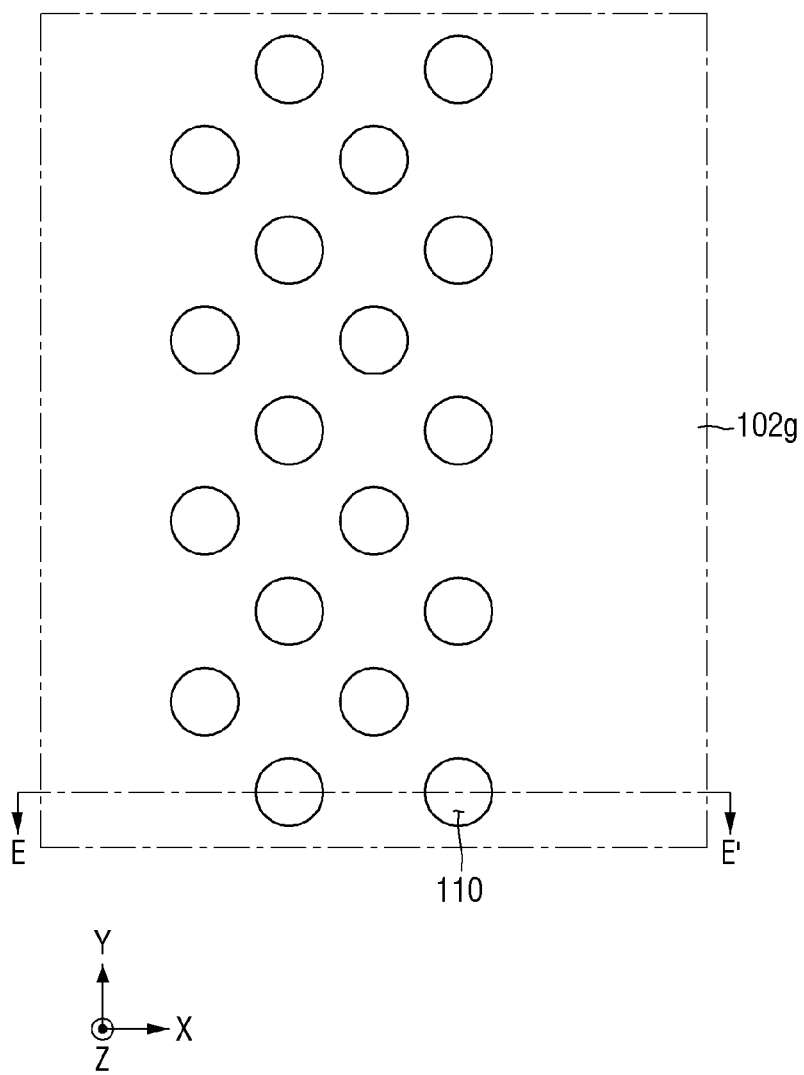
Figure 11:
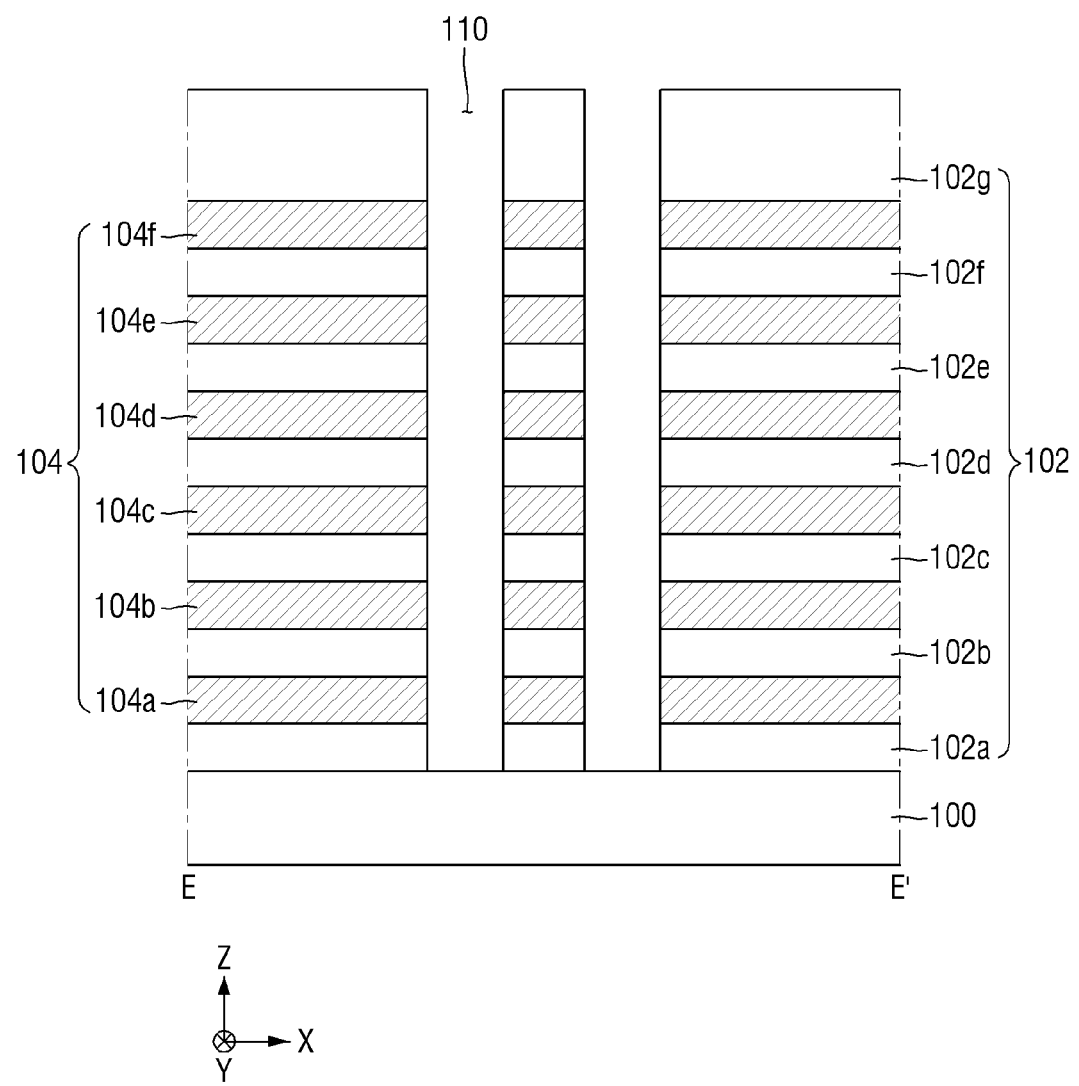
Figure 12:
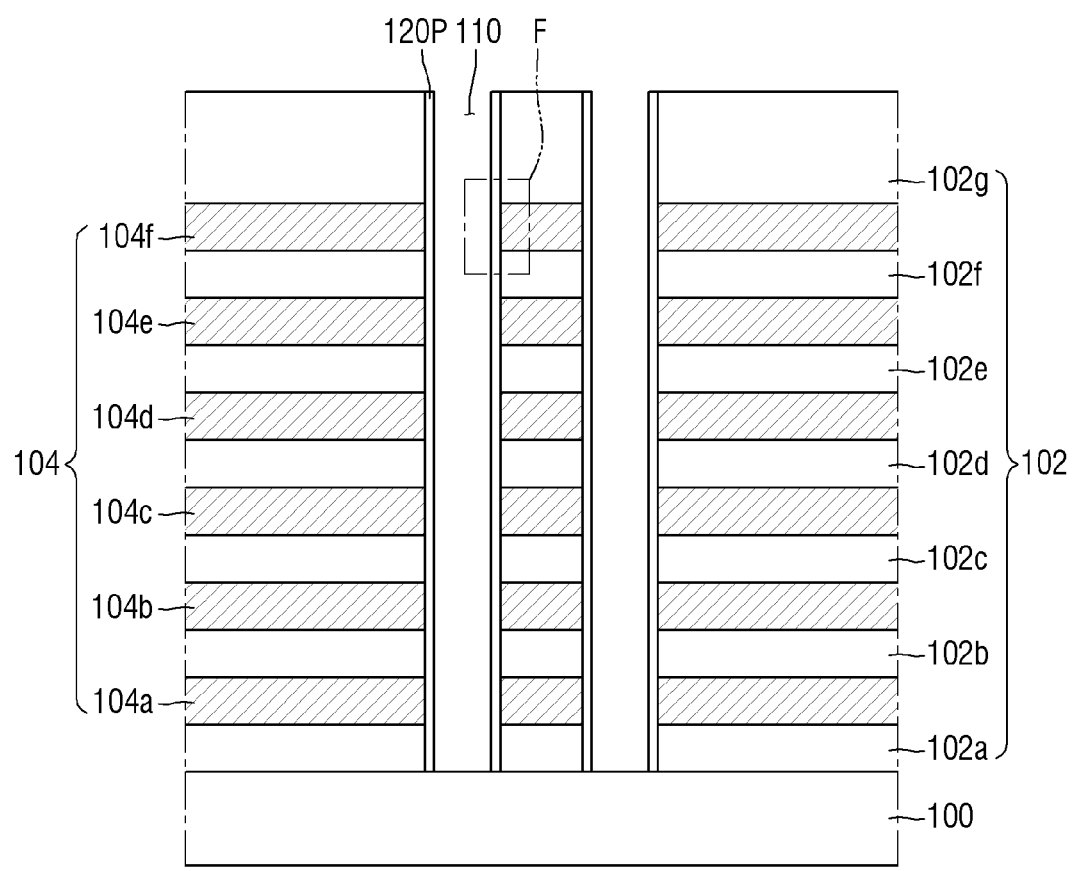
Figure 13:
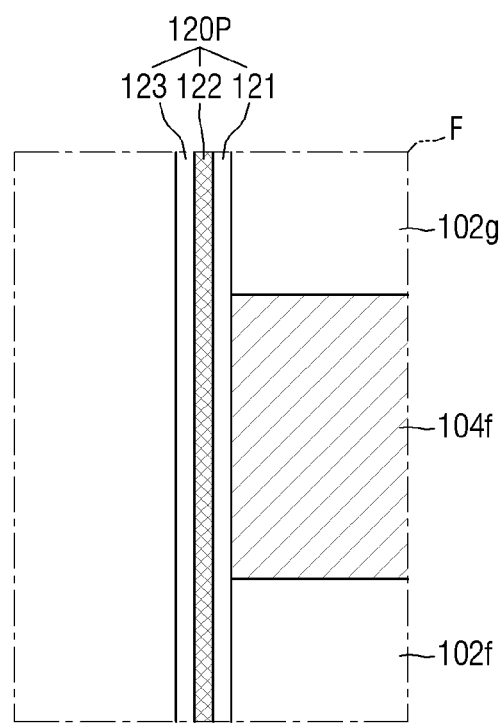
Figure 18:
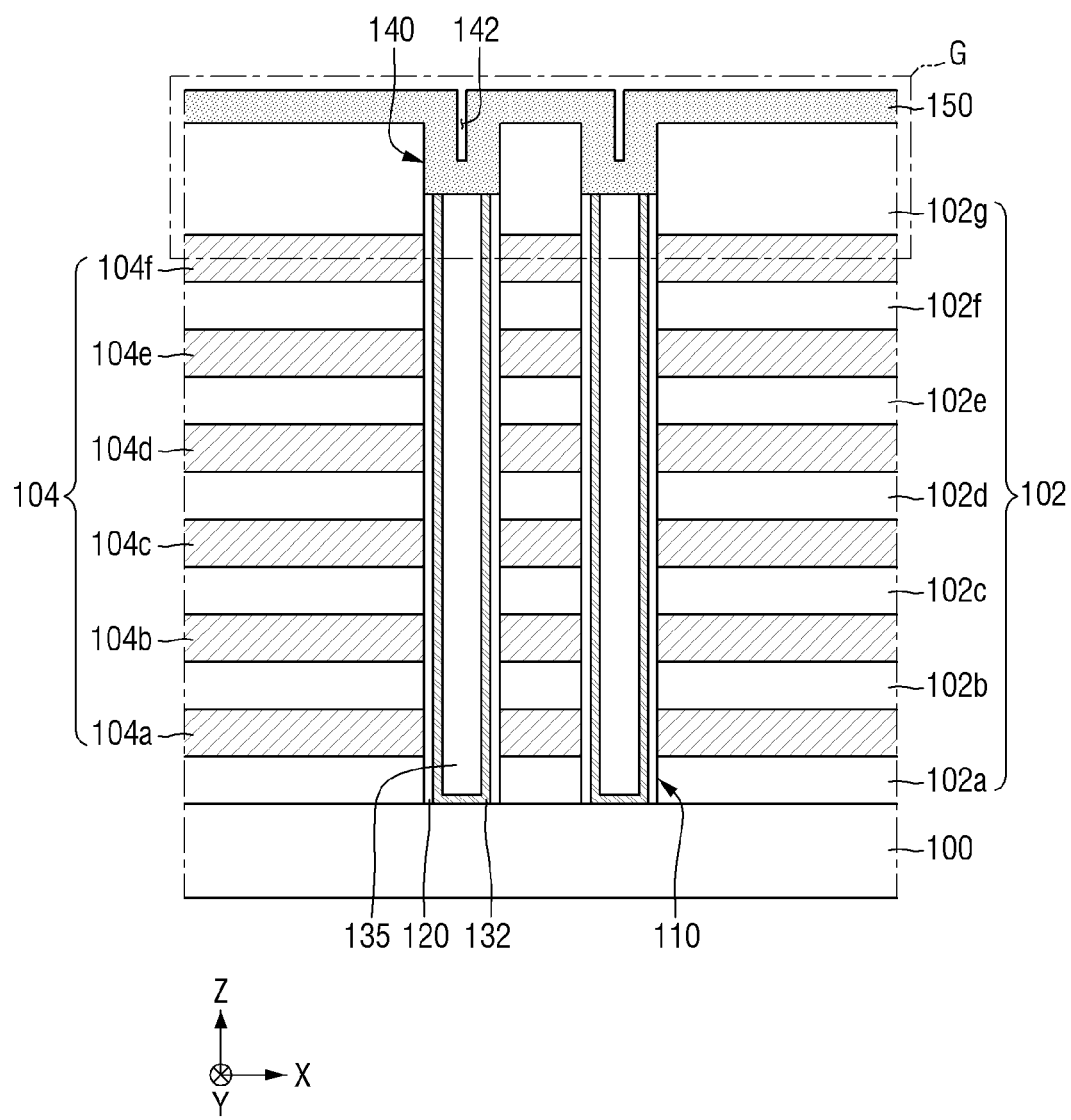
Figure 19:
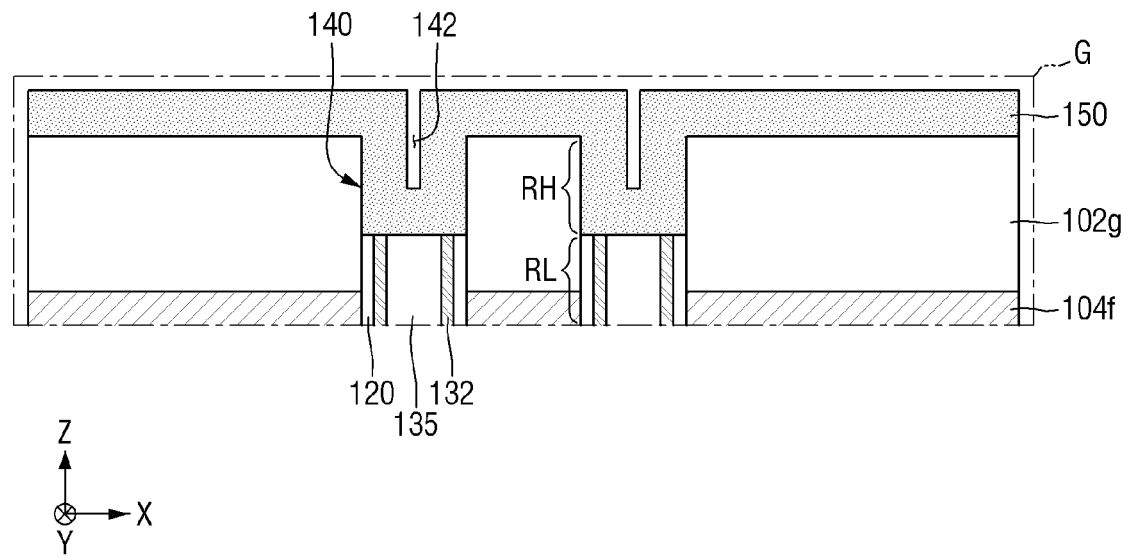
Figure 25:
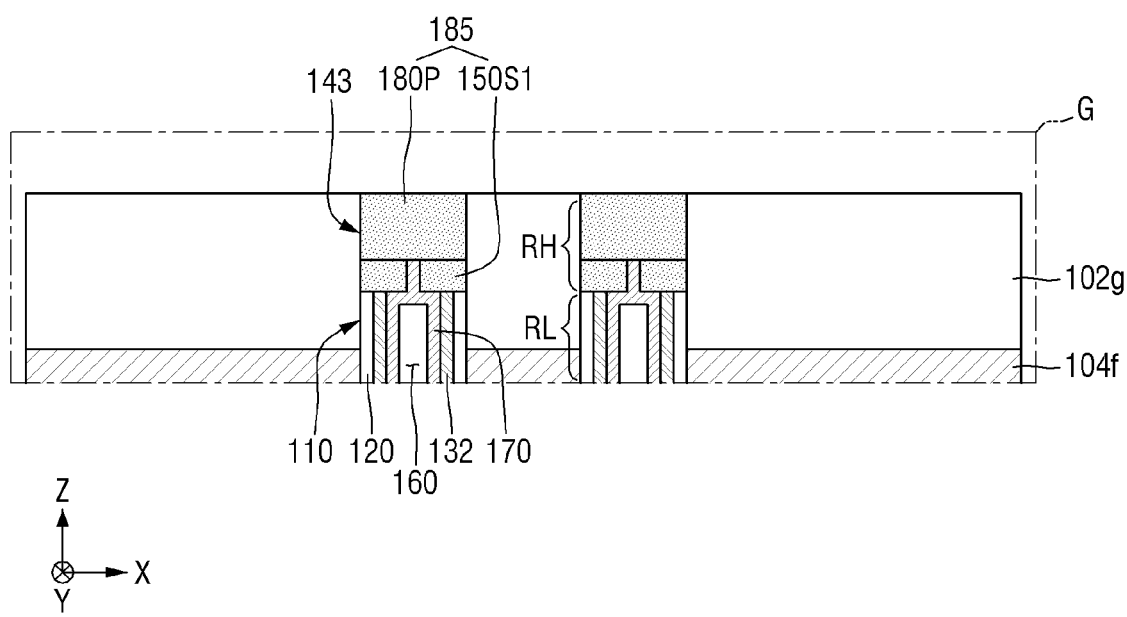
Figure 26:
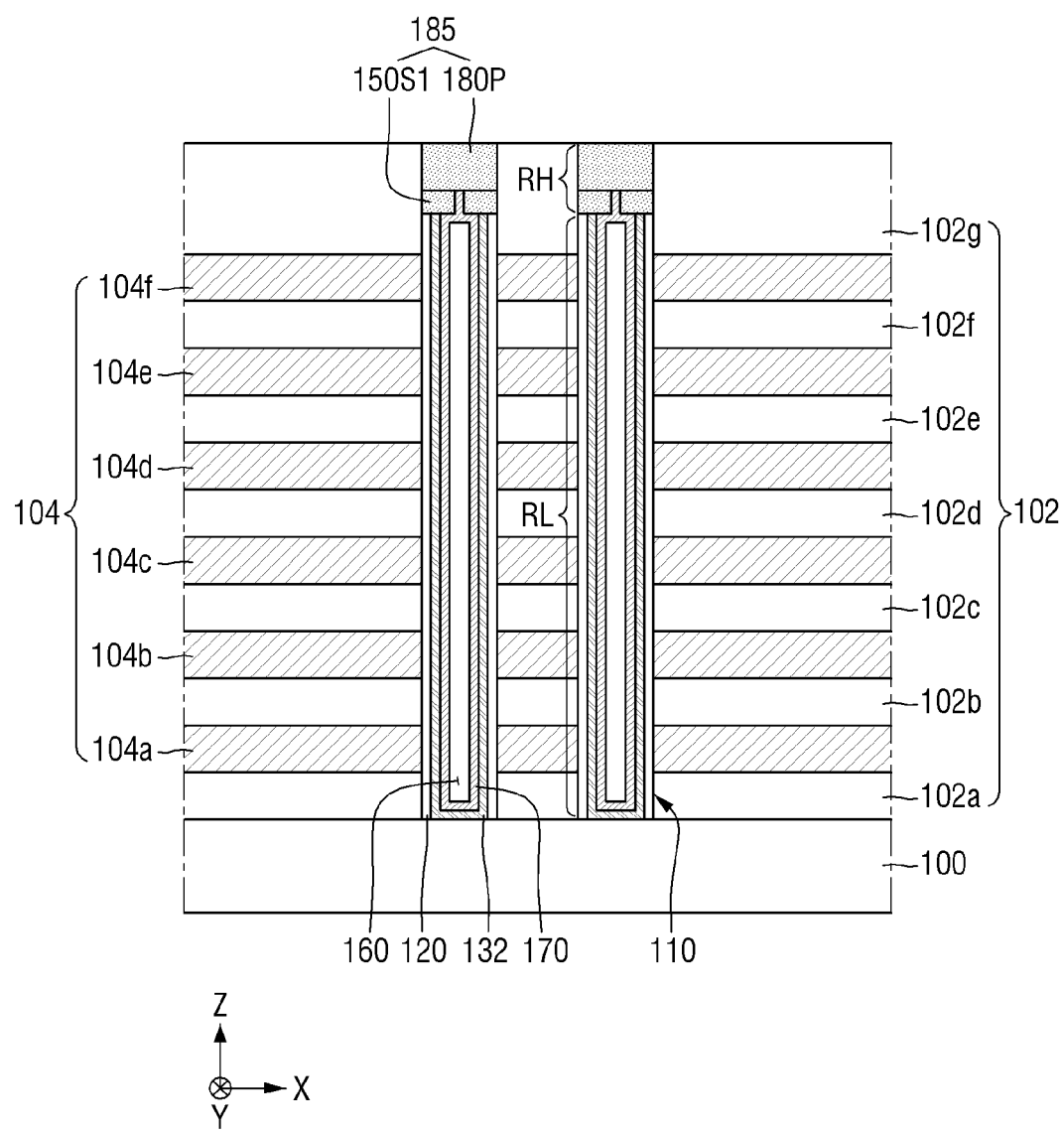
Figure 27:
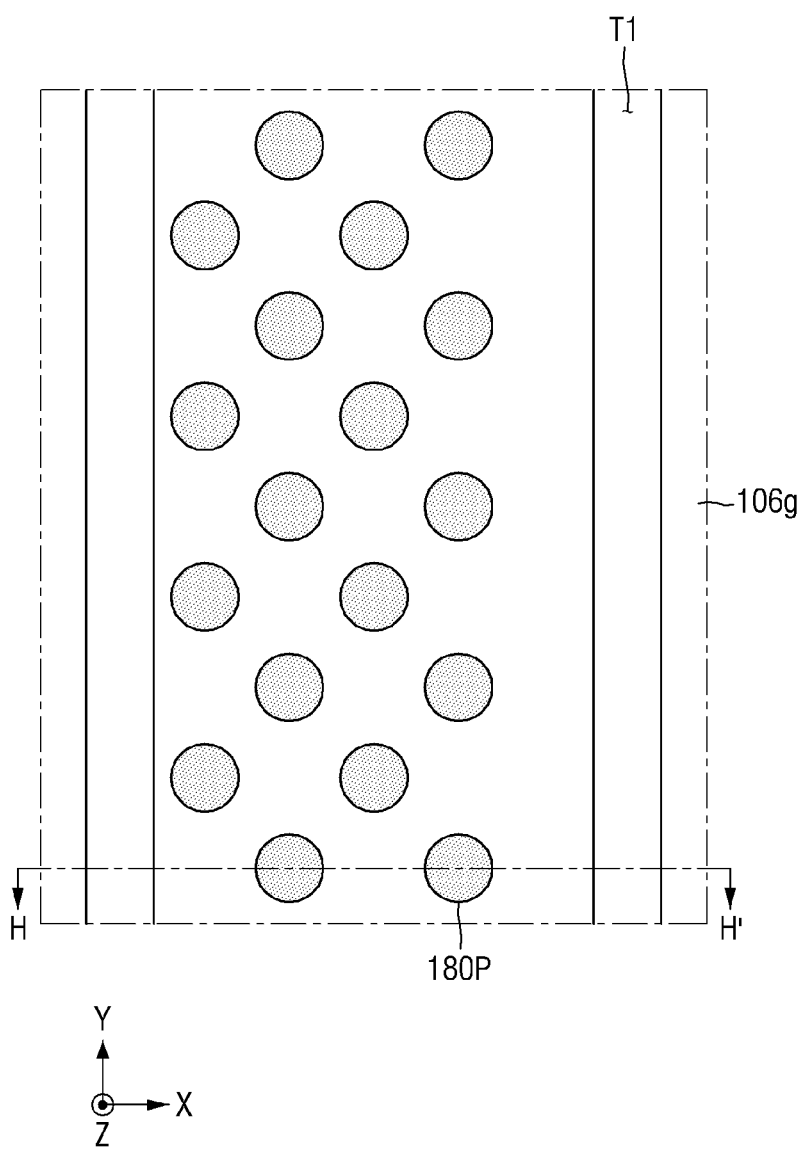
Figure 28:
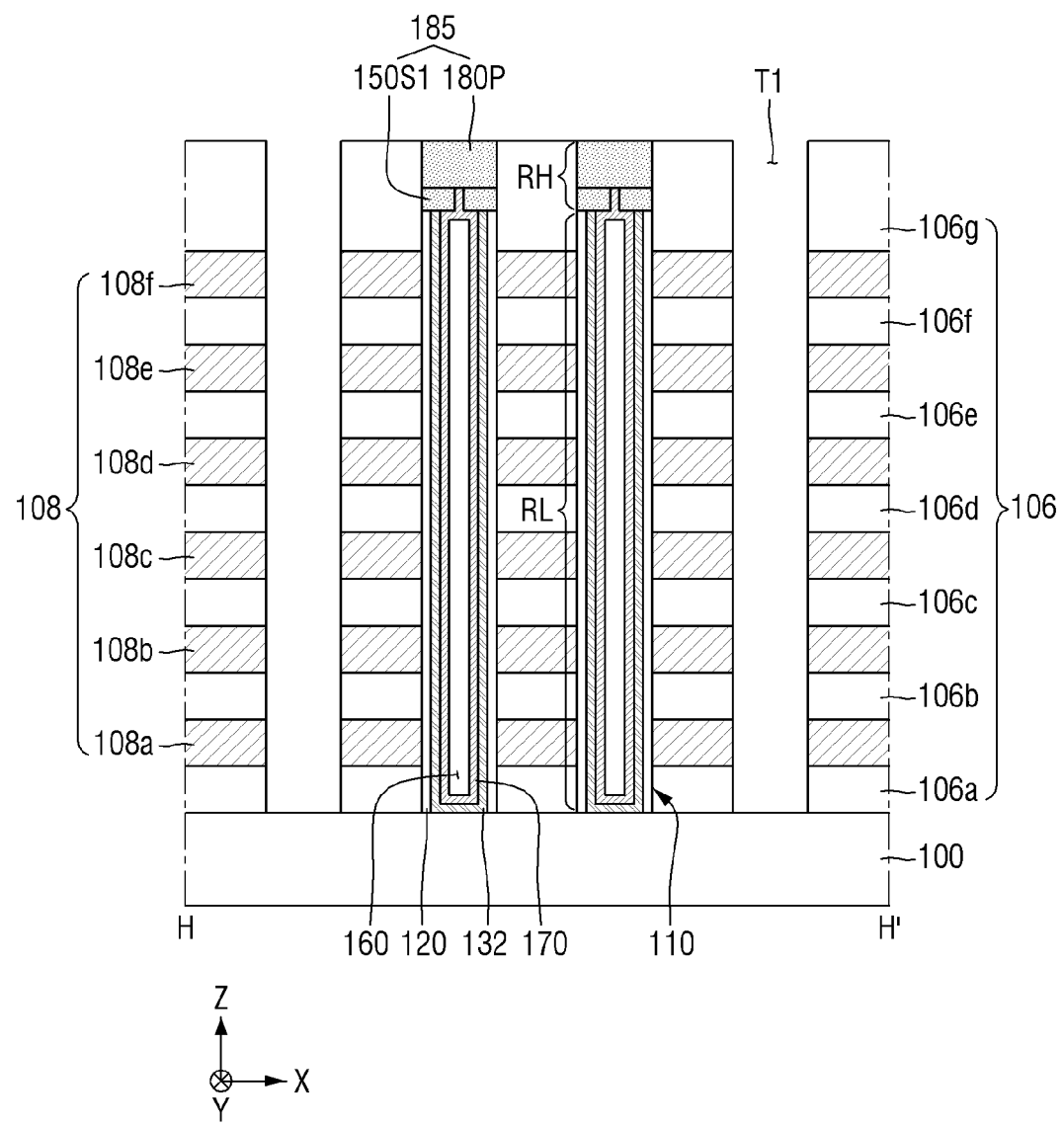

FIGS. 9 to 31 are cross-sectional views for illustrating processing steps of a method for fabricating a semiconductor device according to some exemplary embodiments of the present inventive concept. FIG. 11 is a cross-sectional view taken along line E-E' of FIG. 10. FIG. 13 is an enlarged cross-sectional view of portion F of FIG. 12. FIG. 19 is an enlarged cross-sectional view of portion G of FIG. 18. FIG. 26 is a view of the entirety of the portion shown in FIG. 25. FIG. 28 is a cross-sectional view taken along line H-H' of FIG. 27.

Figure 9:
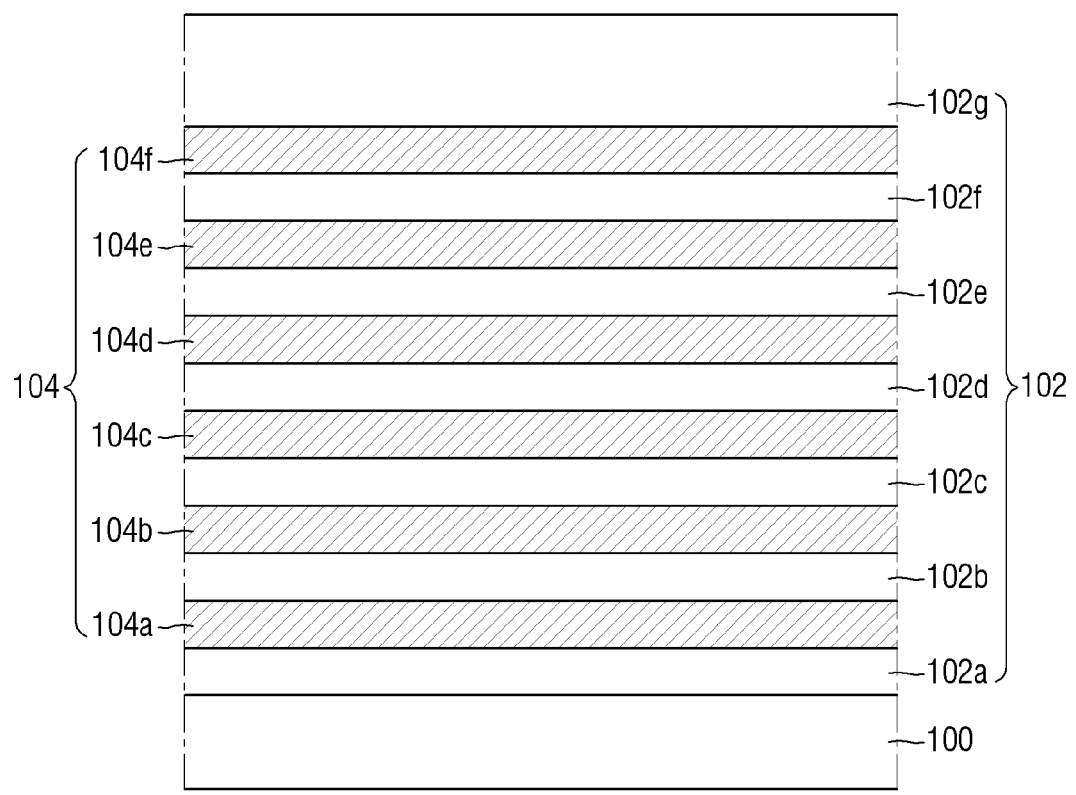
FIGS. 9 to 31 are cross-sectional views for illustrating processing steps of a method for fabricating a semiconductor device according to some exemplary embodiments of the present inventive concept.

Initially, referring to FIG. 9, a molded structure is formed on a substrate 100.

A plurality of sacrificial layers 104 and a plurality of interlayer insulating layers 102 may be alternately stacked on a substrate 100. For example, the sacrificial layers 104 (for example, sacrificial layers indicated as 104a to 104f) and the interlayer insulating layers 102 (for example, interlayer insulating layers indicated as 102a to 102g) may be alternately stacked on one another to form the molded structure.

The sacrificial layers 104 and the interlayer insulating layers 102 may include different materials. The different materials may refer to materials having different etch selectivity with respect to a specific etching solution or etching gas. Accordingly, after performing an etching process with the specific etching solution or etching gas, only the sacrificial layers 104 may be selectively removed from the molded structure so that the interlayer insulating layers 102 remain in the molded structure.

For example, the sacrificial layers 104 may be silicon nitride layers, while the interlayer insulating layers 102 may be silicon oxide layers. However, the present inventive concept is not limited thereto. The materials of the sacrificial layers 104 and the interlayer insulating layers 102, as long as they have different etch selectivity, may be used.

According to the method for fabricating a semiconductor device according to some exemplary embodiments of the present inventive concept, the interlayer insulating layer 102 may include a low-k dielectric material. The low-k dielectric material may refer to a material having a lower dielectric constant than that of silicon oxide.

Although the bottom layer and the top layer in the molded structure are illustrated as the interlayer insulating layers 102, the present inventive concept is not limited thereto. Depending on the processing conditions and the necessity of the method according to this embodiment, the stacking order, the material of the bottom layer or the material the top layer may be selected as desired.

Subsequently, referring to FIGS. 10 and 11, a plurality of channel holes 110 may be formed in the molded structure. For example, the channel holes 110 penetrating the molded structure may be formed.

The channel holes 110 may be formed in the sacrificial layers 104 and the interlayer insulating layers 102 alternately stacked on the substrate 100. For example, the channel hole 110 may penetrate the sacrificial layers 104 and the interlayer insulating layers 102. By forming the channel holes 110, the upper surface of the substrate 100 may be exposed without being covered by the molded structure.

The channel holes 110 may be disposed, for example, in a zigzag pattern and may be spaced apart from one another. By doing so, the density of the channel holes 110 may increase. For example, more channel holes may be formed in a given area. However, the present inventive concept is not limited thereto. In a semiconductor device according to some exemplary embodiments of the present inventive concept, the channel holes 110 may be formed in alignment with one another in the horizontal direction (e.g., the second direction).

As the channel holes 110 are formed, the side surfaces of the interlayer insulating layers 102 and the sacrificial layers 104 in the horizontal direction may also be exposed.

The channel holes 110 may be formed using a hard mask, for example. For example, a hard mask that exposes only the shapes of the channel holes 110 may be formed on an uppermost interlayer insulating layer 102g at the top of the molded structure, and the exposed portion may be etched sequentially by dry etching to form the channel holes 110. Accordingly, the sidewall of the channel holes 110 may have a substantially vertical profile.

Alternatively, in a semiconductor device according to some exemplary embodiments of the present inventive concept, the sidewalls of the channel holes 110 may have tapered shapes. This may happen since the etch rate of the molded structure become low away from the exposed portion.

Subsequently, referring to FIGS. 12 and 13, a preliminary dielectric layer 120P is formed along the inner side walls of the channel holes 110.

An initial dielectric layer may be formed along the upper surface of the uppermost interlayer insulating layer 102g at the top, the side wall and bottom surface of the channel hole 110. Subsequently, portions of the initial dielectric layer formed on the upper surface of the uppermost interlayer insulating layer 102g and on the upper surface of the substrate 100 may be substantially removed through an etch-back process to form a preliminary dielectric layer 120P having a straw shape. The preliminary dielectric layer 120P may expose the upper surface of the substrate 100 and remain on the sidewall of each of channel holes 110. For example, the preliminary dielectric layer 120P may have a hollow cylindrical shape.

The preliminary dielectric layer 120P may include a blocking insulating layer 121, a charge trap layer 122, and a tunnel insulating layer 123. The blocking insulating layer 121 may be in contact with the inner side wall of one of the channel holes 110. The blocking insulating layer 121 may be formed along the inner side wall of the one of the channel holes 110.

The charge trap layer 122 may be in contact with the inner side wall of the blocking insulating layer 121. The charge trap layer 122 may be formed along the inner side wall of the blocking insulating layer 121. The tunnel insulating layer 123 may be in contact with the inner side wall of the charge trap layer 122. The tunnel insulating layer 123 may be formed along the inner side wall of the charge trap layer 122.

The plurality of layers forming the preliminary dielectric layer 120P may be formed via one of a chemical vapor deposition (CVD) process, a plasma enhanced chemical vapor deposition (PECVD) process, and an atomic layer deposition (ALD) process. The plurality of layers need not be formed via the same process. However, it is merely illustrative. For example, the dielectric layer 120 may be formed via other processes than the above-described process.

Figure 14:
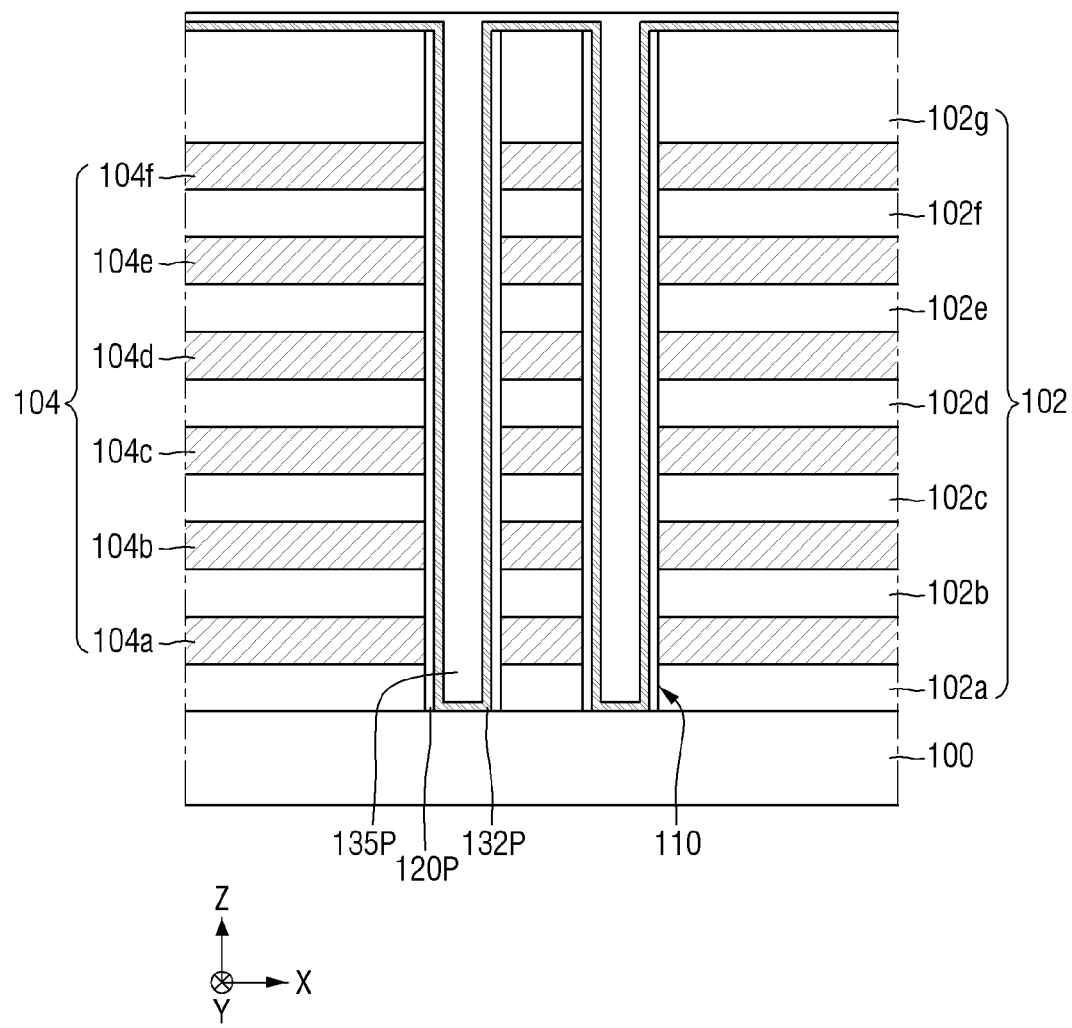
Figure 15:
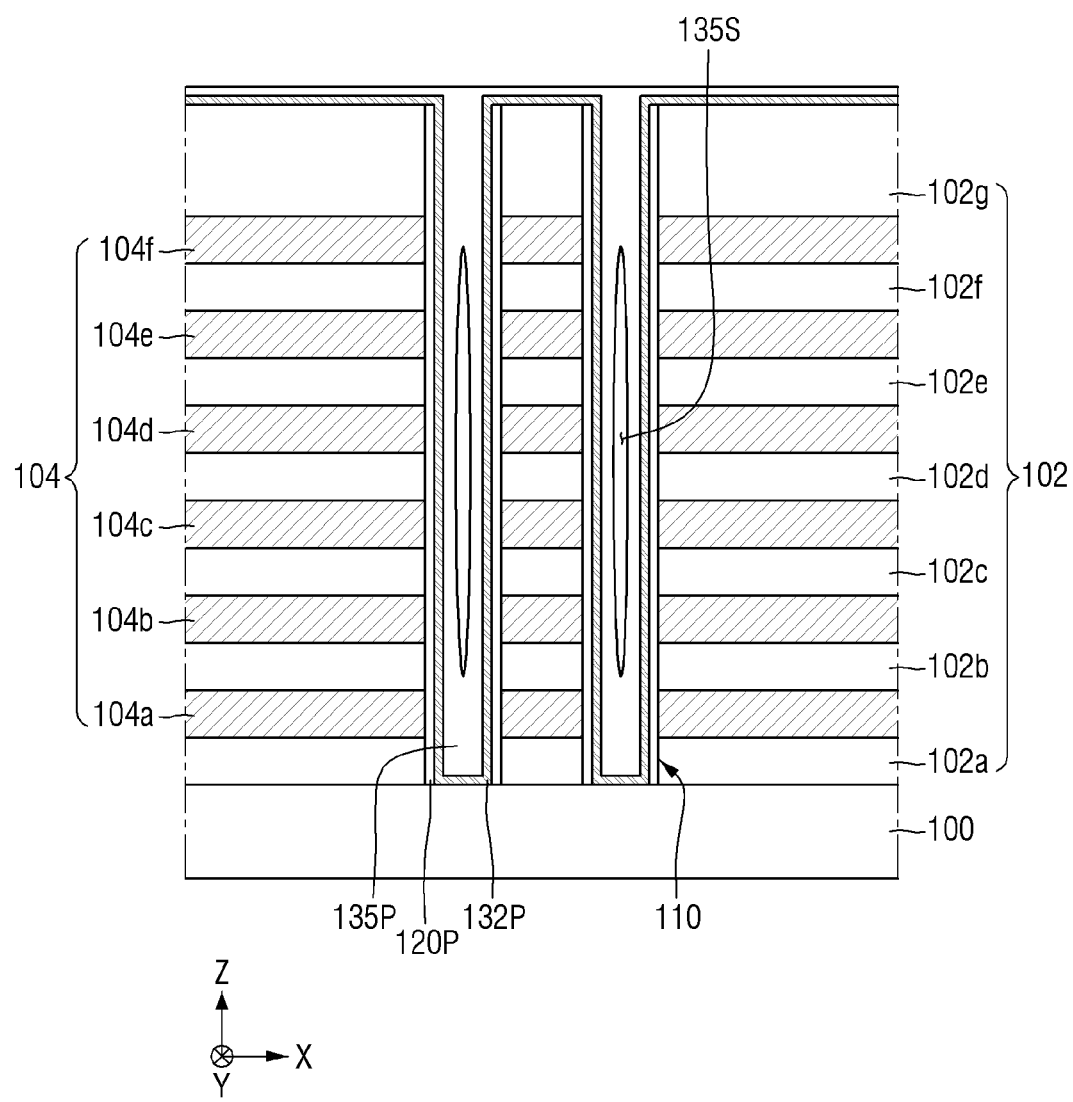

Next, referring to FIGS. 14 and 15, a preliminary channel layer 132P is formed in the channel hole 110.

First, referring to FIG. 14, the preliminary channel layer 132P may be formed along the upper surface of the preliminary dielectric layer 120P. The preliminary channel layer 132P may also be formed along the upper surface of the substrate 100 exposed in the channel holes 110.

According to exemplary embodiments, the preliminary channel layer 132P may be formed using polysilicon or amorphous silicon doped with an impurity. After the preliminary channel layer 132P has been formed using polysilicon or amorphous silicon, it may be changed into monocrystalline silicon by heat treatment or laser beam irradiation. By doing so, defects in the preliminary channel layer 132P may be removed, such that the performance of the semiconductor device may be improved.

Subsequently, a preliminary filling layer 135P is formed to fill the channel holes 110.

The preliminary filling layer 135P may be used to completely fill the channel hole 110. For example, the preliminary filling layer 135P may be surrounded by the preliminary channel layer 132P and the preliminary dielectric layer 120P described above.

The preliminary filling layer 135P may be formed using an insulating material such as silicon oxide. The preliminary channel layer 132P and the preliminary filling layer 135P may be formed via one of a CVD process, a PECVD process, and an ALD process. However, it is merely illustrative.

Referring to FIG. 15, unlike FIG. 14, in the method according to some exemplary embodiments of the present inventive concept, a filling layer seam 135S may be formed in the preliminary filling layer 135P.

This may depend on the step coverage of the preliminary filling layer 135P and the width and depth of the channel hole 110. For example, while FIG. 14 shows no seam formed inside the preliminary filling layer 135P, the filling layer seam 135S may be formed inside the preliminary filling layer 135P as shown in FIG. 15.

Since the preliminary filling layer 135P is completely removed via subsequent processes, it does not affect the resulting structure of the method according to some exemplary embodiments of the present inventive concept whether the filling layer seam 135S is formed or not.

Figure 16:
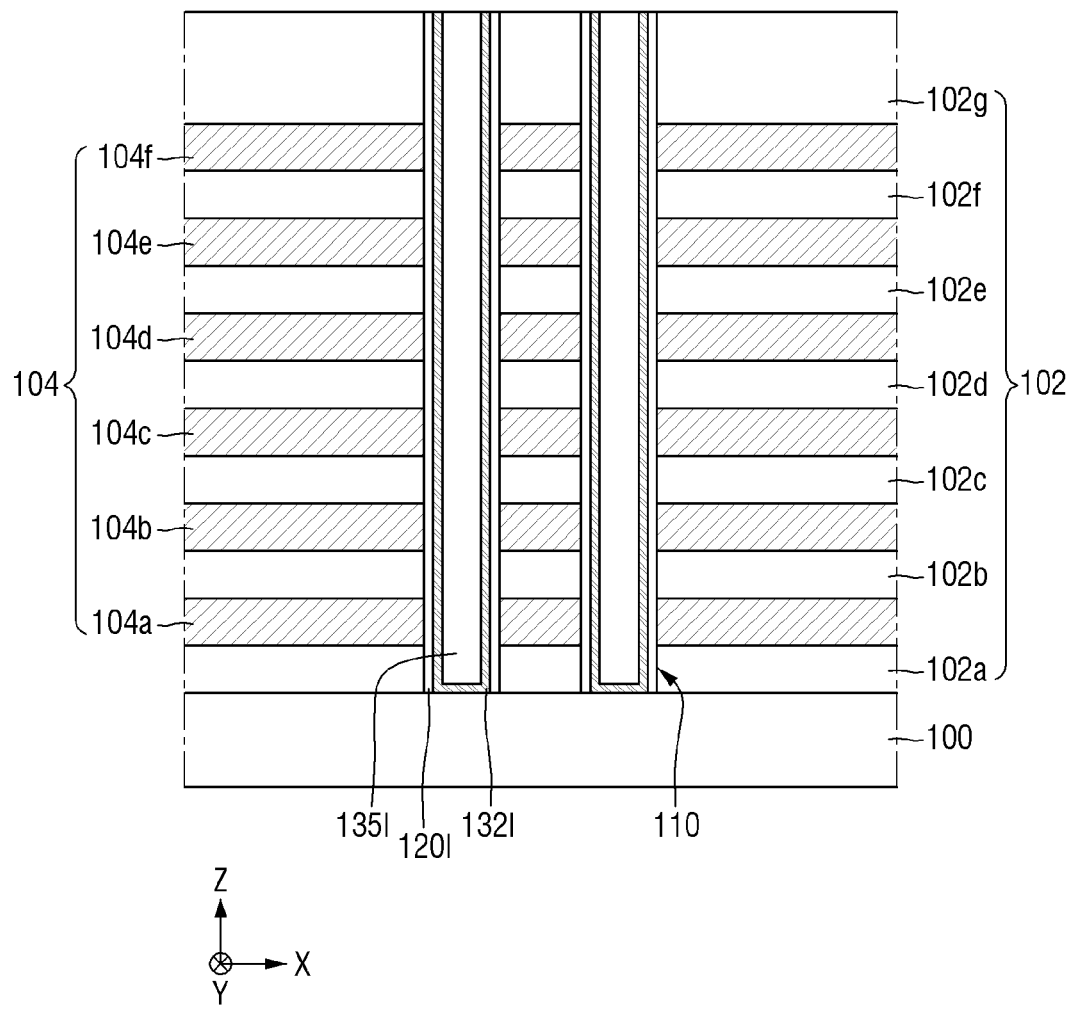

Subsequently, referring to FIG. 16, the preliminary dielectric layer 120P, the preliminary channel layer 132P and the preliminary filling layer 135P are partially removed so that an intermediary dielectric layer 120I, an intermediary channel layer 132I and an intermediary filling layer 135I are formed in the channel holes 110, to perform device isolation.

By removing the preliminary channel layer 132P and the preliminary filling layer 135P formed on the upper surface of the uppermost interlayer insulating layer 102g at the top, the intermediary channel layer 132I and the intermediary filling layer 135I in one channel hole are separated from those in another channel hole.

By doing so, a vertical channel including the intermediary filling layer 135I, the intermediary channel layer 132I and the intermediary dielectric layer 120I may be formed. The vertical channel may be located inside the channel holes 110, and may be formed through the molded structure in which the sacrificial layers 104 and the interlayer insulating layers 102 are alternately stacked on one another.

The device isolation may be carried out by a chemical mechanical polishing (CMP) process. However, the present inventive concept is not limited thereto. For example, the device isolation may be performed using an etchback process.

Subsequently, referring to FIG. 17, a second recess 140 is formed at the top of the channel hole 110.

The second recess 140 may be formed at the top of each of the channel holes 110. In the formation of the second recess 140, the intermediary dielectric layer 120I, the intermediary channel layer 132I, and a part of the intermediary filling layer 135I of FIG. 16 may be removed partially to form the dielectric layer 120, the channel layer 132 and the filling layer 135. The portion where the second recess 140 is formed may later become the high region RH of FIG. 2. In addition, the portion where the dielectric layer 120, the channel layer 132 and the filling layer 135 remain may later become the low region RL of FIG. 2.

The bottom surface of the second recess 140 may be lower than the upper surface of the uppermost interlayer insulating layer 102g but may be higher than the upper surface of an uppermost sacrificial layer 104f.

Subsequently, referring to FIGS. 18 and 19, a spacer layer 150 is formed.

The spacer layer 150 may be formed along the upper surface of the uppermost interlayer insulating layer 102g and the side walls and the lower surface of the second recess 140. Since the spacer layer 150 is formed conformally in the second recess 140, a third recess 142 may be formed therein.

The spacer layer 150 may include a material having an etching selectivity with respect to the filling layer 135. Accordingly, the spacer layer 150 need not be completely etched during a subsequent process of etching of the filling layer 135.

For example, the spacer layer 150 may include polysilicon. However, it is merely illustrative.

The spacer layer 150 may be formed only in the high region RH of each of the channel holes 110, for example. The spacer layer 150 may be formed on the upper surface of the dielectric layer 120, the upper surface of the channel layer 132, and the upper surface of the filling layer 135.

Figure 20:
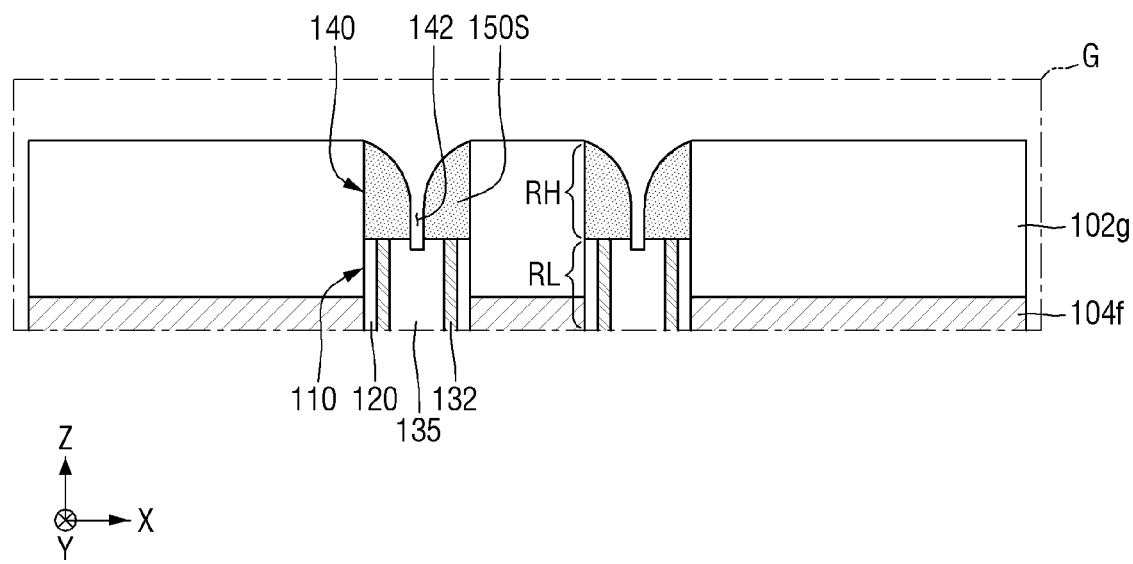

Subsequently, referring to FIG. 20, a spacer 150S is formed.

The spacer 150S may be formed by etching the spacer layer 150. For example, the spacer layer 150 may be partially etched by a dry etching process. By doing so, the upper surface of the uppermost interlayer insulating layer 102g covered by the spacer layer 150 may be exposed. Furthermore, the upper surface of the uppermost interlayer insulating layer 102g may be partially etched.

The third recess 142 may become deeper by the dry etching process. The spacer 150S may include a bottom hole exposing the filling layer 135. The bottom hole may be connected to the third recess 142 and exposing the filling layer 135.

For example, the spacer 150S is formed along the inner side surface of the high region RH of one of the channel holes 110 but does not completely cover the center of the one of the channel holes 110. The spacer 150S may include the bottom hole exposing the center, i.e., the third recess 142.

The upper surface of the filling layer 135 exposed via the third recess 142 may have a shape partially etched and dented. The present inventive concept is not limited thereto. For example, the upper surface of the filling layer 135 may flat depending on the degree of the dry etching.

Figure 21:
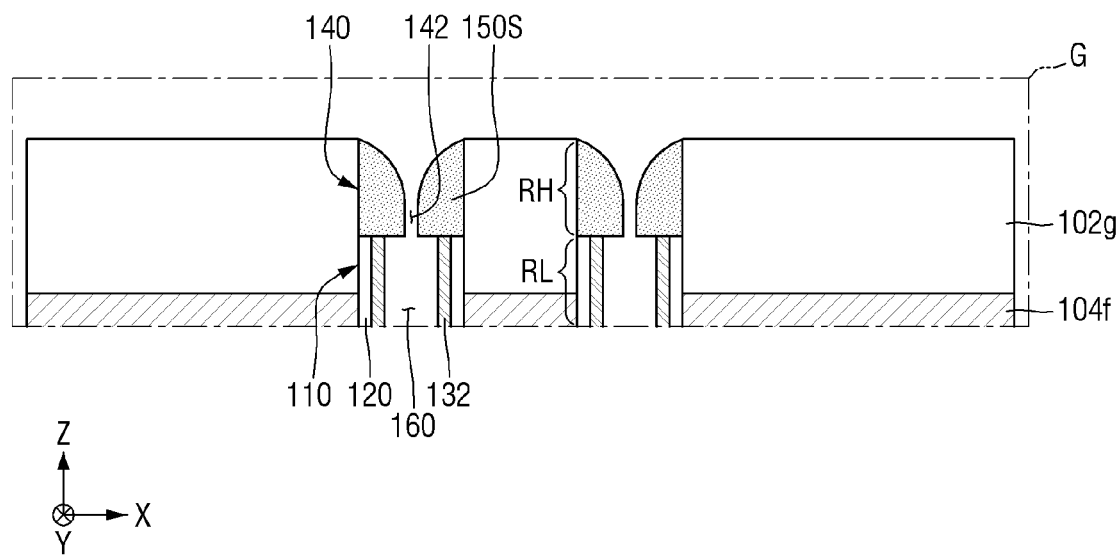

Subsequently, referring to FIG. 21, the filling layer 135 may be completely removed via the third recess 142, that is, the bottom hole.

Since the spacer 150S has an etch selectivity with respect to the filling layer 135, the spacer 150S need not be removed.

Accordingly, the low region RL of each of the channel holes 110 may be empty except for the dielectric layer 120 and the channel layer 132, which are formed on the inner side wall of each of the channel holes 110. The empty space may be referred to as an air gap 160.

For example, the filling layer 135 may be removed via the third recess 142 to form the air gap 160.

Subsequently, referring to FIG. 22, a preliminary passivation layer 170P is formed.

The preliminary passivation layer 170P may be formed along the upper surface of the uppermost interlayer insulating layer 102g, the side surface and the lower surface of the spacer 150S, and the inner side surface of the channel layer 132. The lower layer 170a and the horizontal layer 170b of the passivation layer 170 shown in FIG. 5 may be formed during this process. The protrusion 170c of FIG. 5 may be formed via a subsequent etching process.

There may be formed an overhang in the passivation layer 170 formed between the side surface and lower surface of the spacer 150S. However, it is merely illustrative.

The air gap 160 may be completely sealed by the preliminary passivation layer 170P. In addition, the low region RL and the high region RH of the channel hole 110 may be separated from each other by the preliminary passivation layer 170P.

The preliminary passivation layer 170P may be used to partially fill the third recess 142 to fill the bottom hole exposed by the spacer 150S. For example, the preliminary passivation layer 170P may separate the third recess 142 from the air gap 160.

In the high region RH, the preliminary passivation layer 170P is formed along the surface of the spacer 150S, such that it may have the vertical cross section in Y-shape. In a three-dimensional view, the preliminary passivation layer 170P may have a concave shape at the center.

Figure 23:
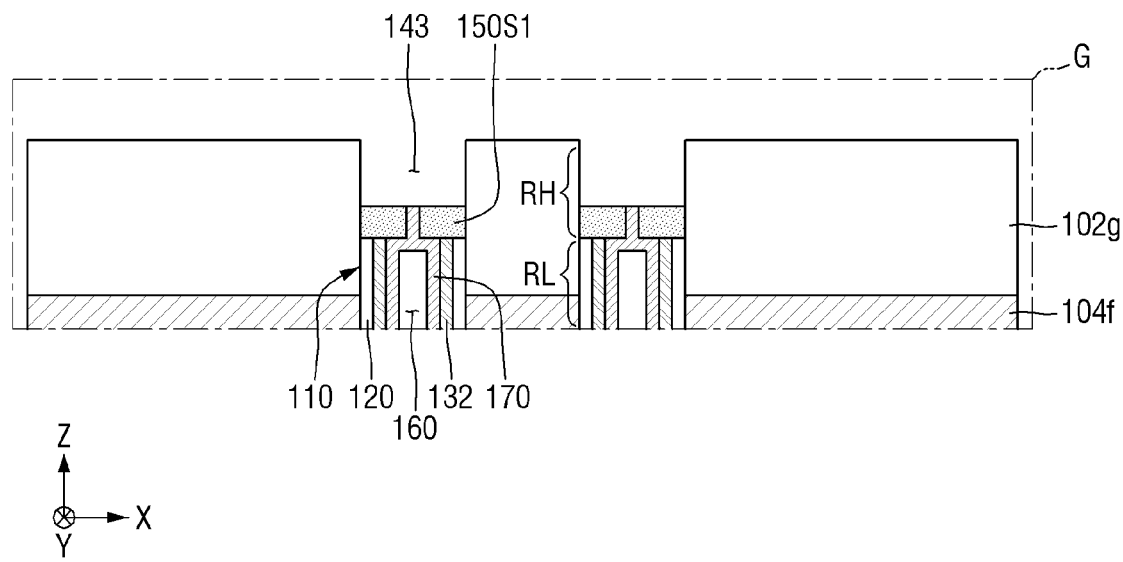

Subsequently, referring to FIG. 23, a part of the spacer 150S and a part of the preliminary passivation layer 170P may be removed.

After the part of the spacer 150S and the part of the preliminary passivation layer 170P are removed, the first recess 143 and the preliminary passivation layer 170P may be formed. For example, after the part of the spacer 150S and the part of the passivation layer 170 are removed, the protrusion 170c of the passivation layer 170 of FIG. 5 may be formed. In addition, as the part of the spacer 150S is removed, the first pad 150S1 may be formed.

Therefore, the bottom surface of the first recess 143 may include the upper surface of the protrusion 170c of FIG. 5 and the upper surface of the first pad 150S1. For example, the bottom surface of the first recess 143 may defined by the upper surface of the protrusion 170c and the upper surface of the first pad 150S1.

Figure 22:
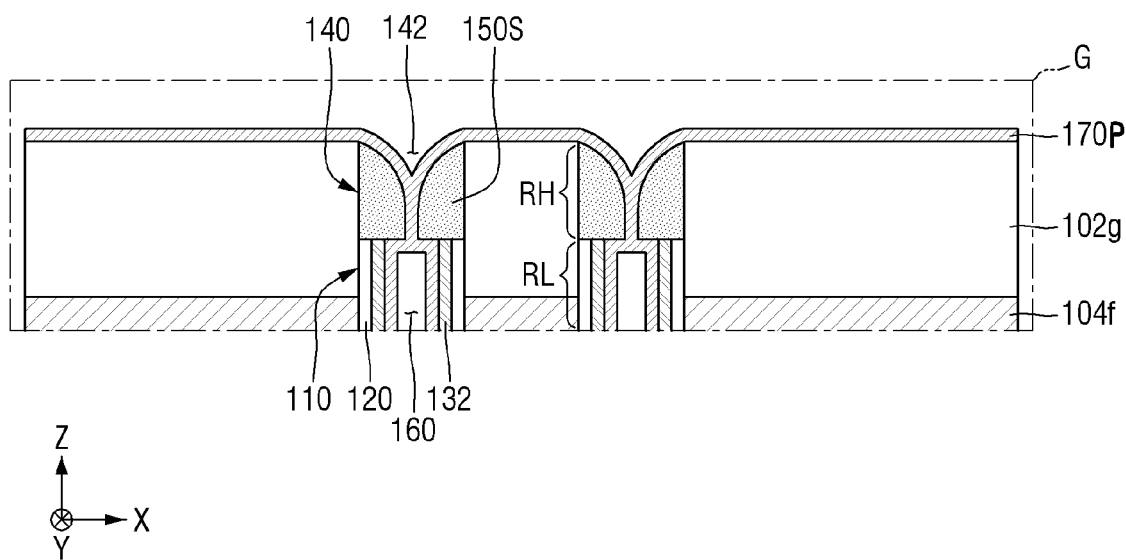

The preliminary passivation layer 170P was Y-shape branching in two directions as shown in FIG. 22 and then may be etched so that the passivation layer 170 may be formed to extend in one direction, i.e., the third direction Z (i.e., the protrusion 170c shown in FIG. 5).

Figure 24:
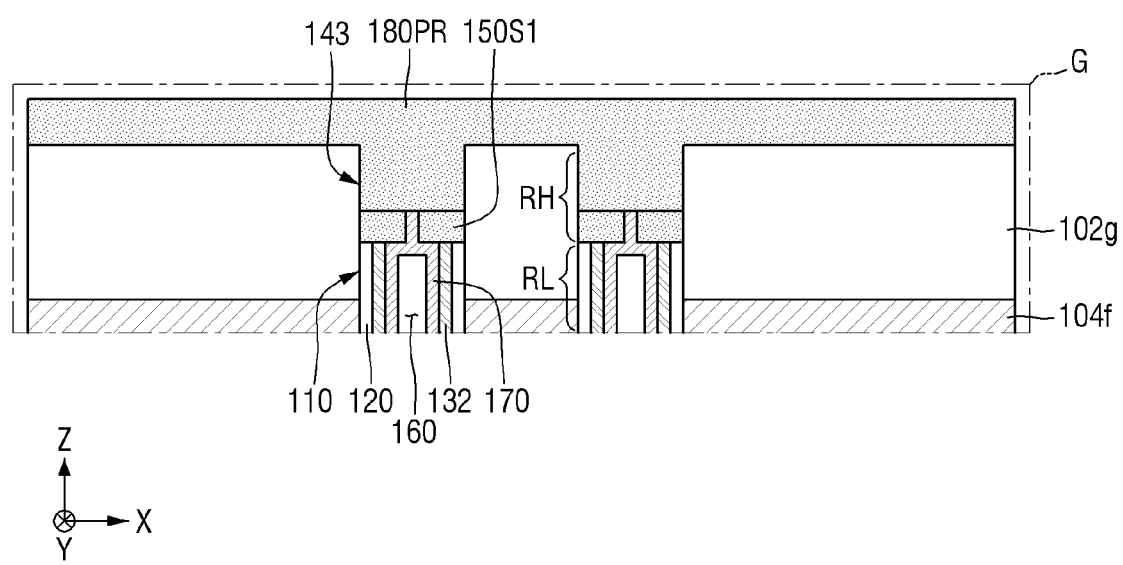

Subsequently, referring to FIG. 24, the first recess 143 may be filled with a preliminary pad layer 180PR. The preliminary pad layer 180PR may be formed on the upper surface of the uppermost interlayer insulating layer 102g.

The preliminary pad layer 180PR may include the same material as the first pad 150S1. The preliminary pad layer 180PR may become the second pad 180P later. The pad layer 180 may include, for example, polysilicon.

The preliminary pad layer 180PR may fill completely the first recess 143 formed in each of the channel holes 110.

Subsequently, referring to FIGS. 25 and 26, the second pad 180P is formed.

A part of the preliminary pad layer 180PR may be etched to form the second pad 180P. The portion of the pad layer 180 on the upper surface of the uppermost interlayer insulating layer 102g may be removed. This allows device isolation of the second pad 180P. For example, the second pad 180P may be formed only in the channel holes 110, such that a second pad formed in a channel hole may be separated from another second pad formed in another channel hole.

The preliminary pad layer 180PR may be planarized by a chemical mechanical polishing (CMP) process to form the second pad 180P. Accordingly, the upper surface of the second pad 180P may be coplanar with the upper surface of the uppermost interlayer insulating layer 102g. However, it is merely illustrative.

Subsequently, the second pad 180P, the first pad 150S1 or both may be doped with impurities via an ion implant (IIP) process. The pad 185 may serve as a drain node of the semiconductor device.

Subsequently, referring to FIGS. 27 and 28, a trench T1 may be formed in the molded structure of the sacrificial layers 104 and the interlayer insulating layers 102 to form a plurality of sacrificial layer patterns 108 and a plurality of interlayer insulating layer patterns 106.

The trench T1 may be formed spaced apart from the channel holes 110. The trench T1 may be formed spaced apart from the filling layer 135, the channel layer 132 and the dielectric layer 120 in the horizontal direction, i.e., in the first direction X.

The trench T1 may expose the upper surface of the substrate 100. The trench T1 may also expose the side surfaces of the interlayer insulating layer patterns 106 and the side surfaces of sacrificial layer patterns 108. The trench T1 may be formed to extend in the second direction Y, for example, unlike the channel holes 110.

Although not shown in the drawings, the trench T1 may be formed via a hard mask partially exposing the interlayer insulating layer patterns 106 at the top. The hard mask may be used as an etch mask in a dry etching process to etch the interlayer insulating layer 102 and the sacrificial layer 104, such that the trench T1 may be formed. The hard mask may be formed using, for example, a photoresist or a spin-on-hardmask (SOH) material. The hard mask may also be removed via an ashing process, a strip process or both after the trench T1 has been formed.

The sacrificial layer patterns 108 and the interlayer insulating layer patterns 106 may be formed by the trench T1 penetrating the sacrificial layers 104 and the interlayer insulating layers 102. The sacrificial layer patterns 108 (i.e., sacrificial patterns indicated as 108a to 108f) and the interlayer insulating layer pattern 106 (i.e., interlayer insulating layer patterns indicated as 106a to 106g) may be disposed, and the numbers thereof are not particularly limited.

Figure 29:
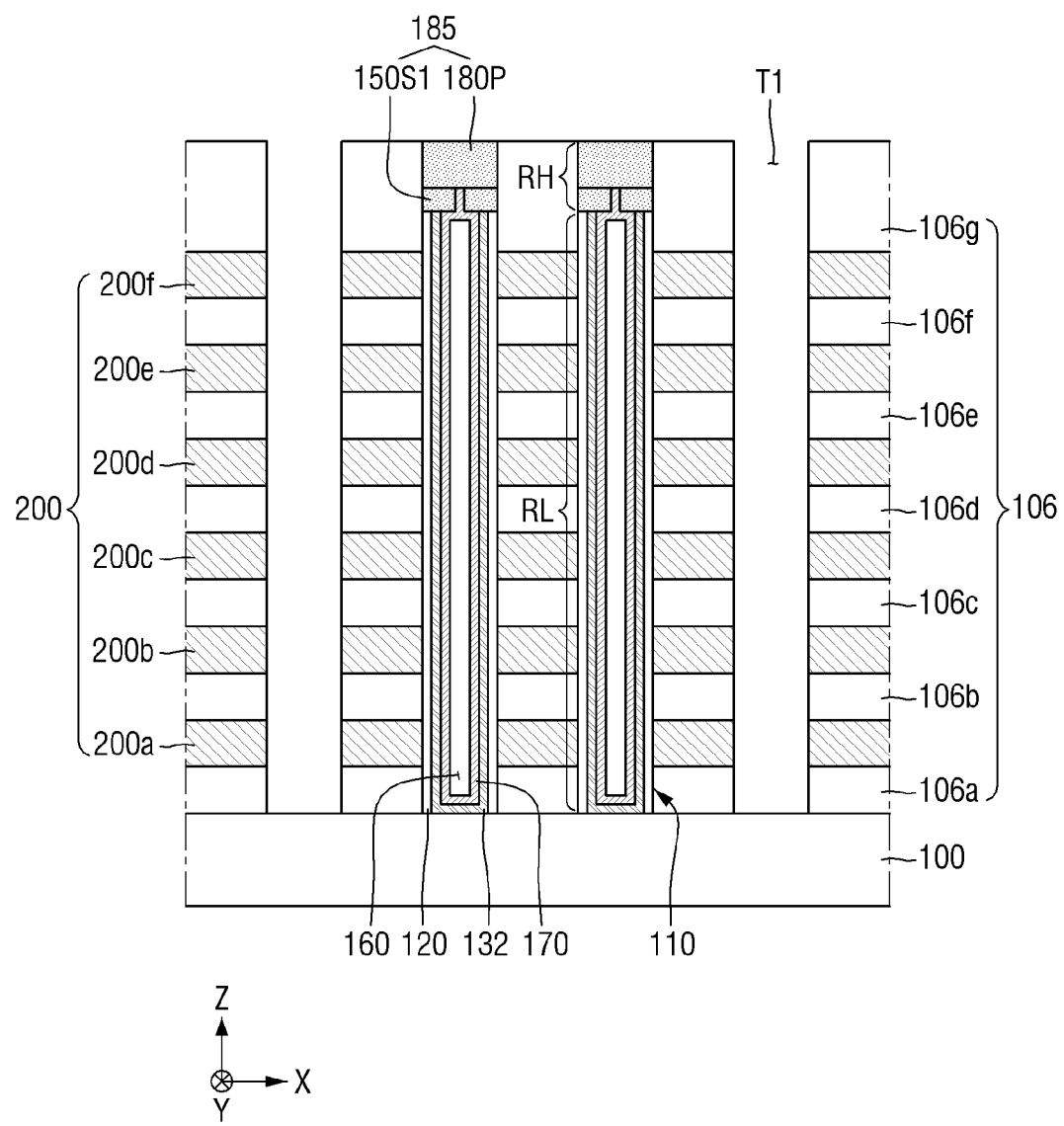

Subsequently, referring to FIG. 29, the sacrificial layer patterns 108 are removed, and a plurality of conductive layer patterns 200 are formed.

The sacrificial layer patterns 108 may be completely removed through the side surface exposed by the trench T1. Since the interlayer insulating layer patterns 106 have the etch selectivity with respect to the sacrificial layer patterns 108, only the sacrificial layer patterns 108 may be completely removed and the interlayer insulating layer patterns 106 remain.

Once the sacrificial layer patterns 108 are removed, the conductive layer patterns 200 may be formed in the place where the sacrificial layer patterns 108 were. As the conductive layer patterns 200 are formed in place of the sacrificial layer patterns 108, it may be said that the sacrificial layer patterns 108 are replaced with the conductive layer patterns 200.

When the sacrificial layer patterns 108 are removed during the replacing process, the vertical channel including the air gap 160, the passivation layer 170, the channel layer 132, the dielectric layer 120 and the pad 185 may have a circular structure in a horizontal cross-sectional view. The interlayer insulating layer patterns 106 may penetrate the vertical channel and may be spaced apart from one another. The interlayer insulating layer patterns 106 may be supported by the vertical channel such that they are spaced apart from one another vertically.

Although the cross-section of the only two vertical channels are shown in the drawings, several vertical channels aligned in the horizontal direction may support the structure of the interlayer insulating layer patterns 106.

Figure 30:
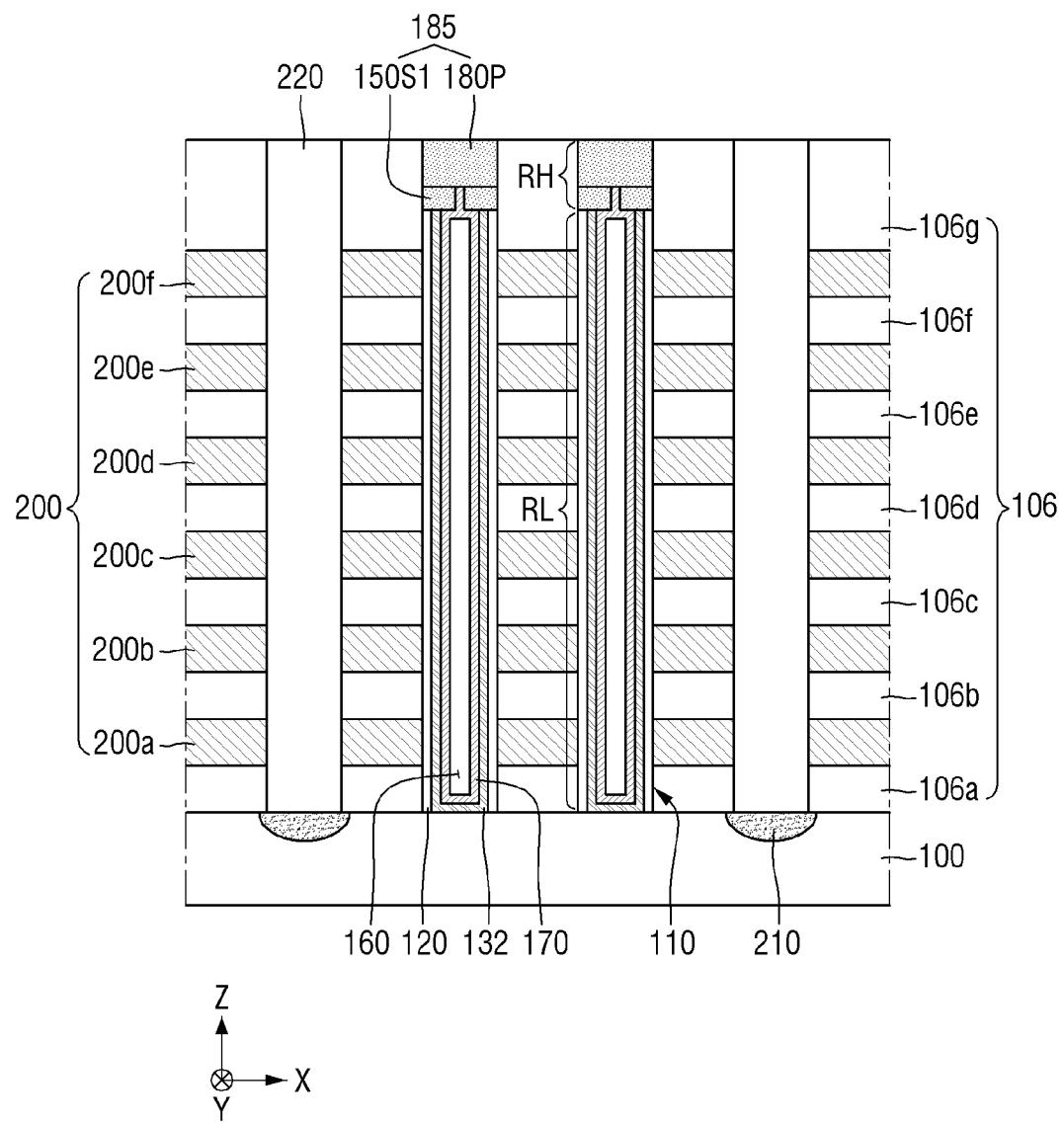

Subsequently, referring to FIG. 30, a common source region 210 may be formed in a portion of the substrate 100 exposed via the trench T1. The common source region 210 may be formed using, for example, a doping process. The common source region 210 may be formed in the substrate 100.

The common source region 210 may be extended in the direction that the above-described trench T1 is extended, i.e., the second direction Y and may serve as a common source line (CSL). According to some exemplary embodiments of the present inventive concept, a metal silicide pattern, such as a nickel silicide pattern and a cobalt silicide pattern, may be further formed on the common source region 210 to reduce the resistance between the common source region 210 and, for example, a CSL contact. After the formation of the common source region 210, a buried layer 220 may be formed in the trench T1.

Figure 31:
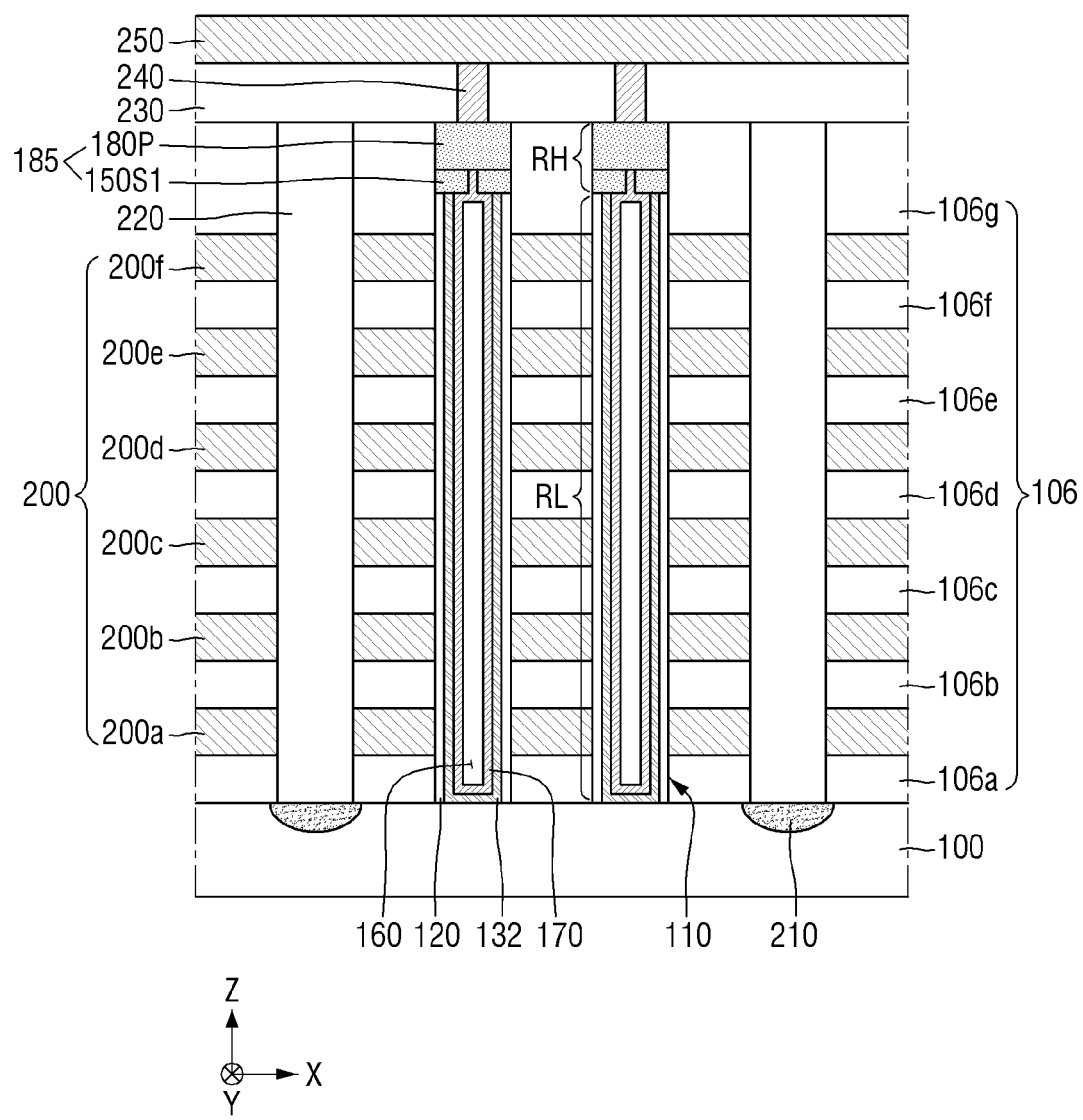

Subsequently, referring to FIG. 31, an upper insulating layer 230, a conductive contact 240, and a bit line 250 are formed on the resulting structure of FIG. 30.

The upper insulating layer 230 may be formed on the buried layer 220 and the pad 185. The upper insulating layer 230 may be formed via a process such as a chemical vapor deposition (CVD) process, a plasma enhanced CVD (PECVD) process and an atomic layer deposition (ALD) process. However, it is merely illustrative. The conductive contact 240 may penetrate the upper insulating layer 230. The conductive contact 240 may include a conductor. For example, the conductive contact 240 may include at least one of a metal, a metal nitride, a metal silicide, and doped polysilicon. However, it is merely illustrative.

The bit lines 250 may extend in the first direction X on the upper insulating layer 230 and the conductive contact 240. The bit lines 250 may be in contact with and electrically connected to the conductive contact 240.

The method of fabricating a semiconductor device according to some exemplary embodiments of the present inventive concept may include forming an air gap 160 inside the channel layer 132 using a spacer. By doing so, it is possible to eliminate the stress applied to the channel layer 132, and reduce a variety of defects, thereby providing a semiconductor device having better operation performance.

In an exemplary embodiment, a height of an upper surface of the air gap 160 may be greater than a height of an upper surface of an uppermost conductive layer pattern 200f of the conductive layer patterns 200.

Hereinafter, a method of fabricating a semiconductor device according to some exemplary embodiment of the present inventive concept will be described with reference to FIGS. 6, 9 to 22, and 32. Descriptions of the identical elements described above will not be made to avoid redundancy.

Figure 32:
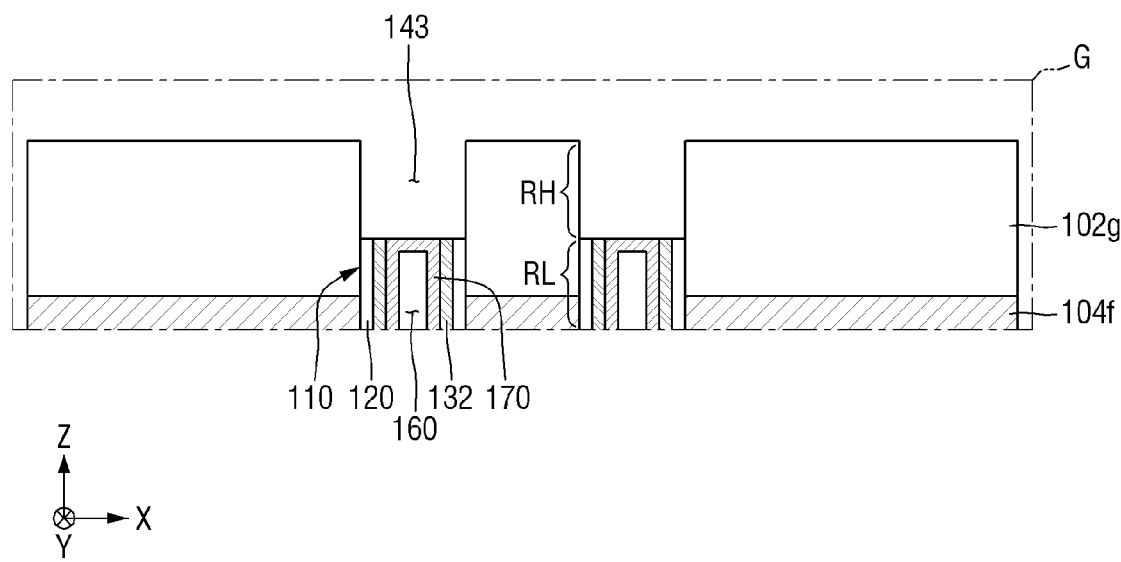
FIG. 32 is a diagram showing a processing step of the method according to some embodiments of the present inventive concept.

FIG. 32 is a diagram showing a processing step of the method according to some embodiments of the present inventive concept.

In this exemplary embodiment of the present inventive concept, the processes of FIGS. 9 to 22 may be performed in the same manner as in the above-described embodiment. Hereinafter, subsequent processes will be described with reference to FIG. 32.

Referring to FIG. 32, the entire of the spacer 150S and a part of the preliminary passivation layer 170P of FIG. 22 may be removed.

After the entire of the spacer 150S and the part of the passivation layer 170 are removed, the first recess 143 may be formed with the horizontal layer 170b and the lower layer 170a of the passivation layer 170 of FIG. 5. The protrusion 170c need not be formed. In addition, as the spacer 150S is entirely removed, the first pad 150S1 of FIG. 23 need not be formed.

Therefore, the bottom surface of the first recess 143 may include the upper surface of the horizontal layer 170b of FIG. 5, the upper surface of the channel layer 132, and the upper surface of the dielectric layer 120.

Referring to FIG. 6, the pad 186 may be formed as a single element, to fill the first recess 143. As a result, there may be provided a semiconductor device with the reduced resistance between the channel layer 132 and the pad 186.

Hereinafter, a method of fabricating a semiconductor device according to some exemplary embodiments of the present inventive concept will be described with reference to FIGS. 7, 9 to 21, and 33. Descriptions of the identical elements described above will not be made to avoid redundancy.

Figure 33:
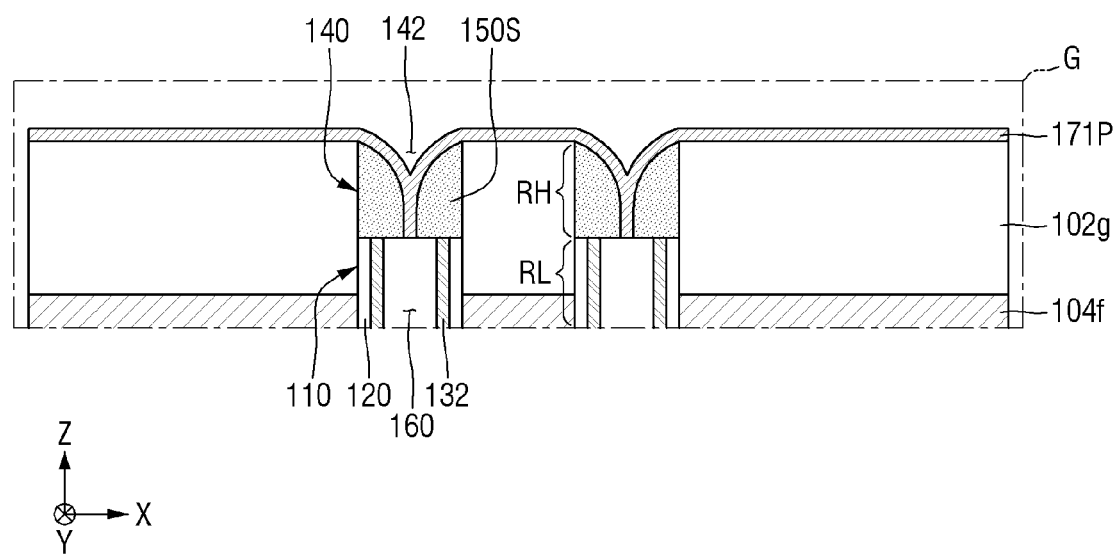
FIG. 33 is a diagram showing a processing step of the method according to some embodiments of the present inventive.

FIG. 33 is a diagram showing a processing step of the method according to some embodiments of the present inventive concept.

In this exemplary embodiment of the present inventive concept, the processes of FIGS. 9 to 21 may be performed in the same manner as in the above-described embodiment. Hereinafter, subsequent processes will be described with reference to FIG. 33.

Referring to FIG. 33, a preliminary passivation layer 171P may be formed.

The preliminary passivation layer 171P may be formed along the upper surface of the uppermost interlayer insulating layer 102g and the side surface of the spacer 150S. The lower layer 170a and the horizontal layer 170b of the passivation layer 171 shown in FIG. 5 need not be formed. The protrusion 170c of FIG. 5 may be formed via a subsequent etching process.

The air gap 160 may be completely sealed by the preliminary passivation layer 171P. In addition, the lower region RL and the upper region RH of each of the channel holes 110 may be separated from each other by the preliminary passivation layer 171P.

The preliminary passivation layer 171P may partially fill the third recess 142 to fill the bottom hole exposed by the spacer 150S. The third recess 142 may be separated from the air gap 160 by the preliminary passivation layer 171P.

In the high region RH, the preliminary passivation layer 171P may be formed along the surface of the spacer 150S to have a Y-shaped vertical cross section. In a three-dimensional view, the preliminary passivation layer 171P may have a concave shape at the center.

In this exemplary embodiment, the preliminary passivation layer 171P need not be formed toward the low region RL of the channel hole 110 due to the step coverage and the depth and width of the third recess 142. Accordingly, the preliminary passivation layer 171P may be formed only in the upper region RH of each of the channel holes 110.

Referring to FIG. 7, the air gap 160 may be in contact with the channel layer 132. In addition, the pad 185 may be in contact with the air gap 160. The lower surface of the first pad 150S1 may be in contact with the air gap 160.

In the method of fabricating a semiconductor device according to some embodiments of the present inventive concept, as the volume of the air gap 160 increases, the parasitic capacitance between adjacent elements may be lowered.

In addition, since no compressive stress is applied to the channel layer 132 by the preliminary passivation layer 171P, defects between the grains inside the channel layer 132 of polysilicon may be reduced.

Hereinafter, a method of fabricating a semiconductor device according to some exemplary embodiments of the present inventive concept will be described with reference to FIGS. 8, 9 to 17, and 34 to 39. Descriptions of the identical elements described above will not be made to avoid redundancy.

FIGS. 34 to 39 are cross-sectional views for illustrating processing steps of a method for fabricating a semiconductor device according to some exemplary embodiments of the present inventive concept.

In this exemplary embodiment of the present inventive concept, the processes of FIGS. 9 to 17 may be performed in the same manner as in the above-described embodiment. Hereinafter, subsequent processes will be described with reference to FIGS. 34 to 39.

Figure 17:
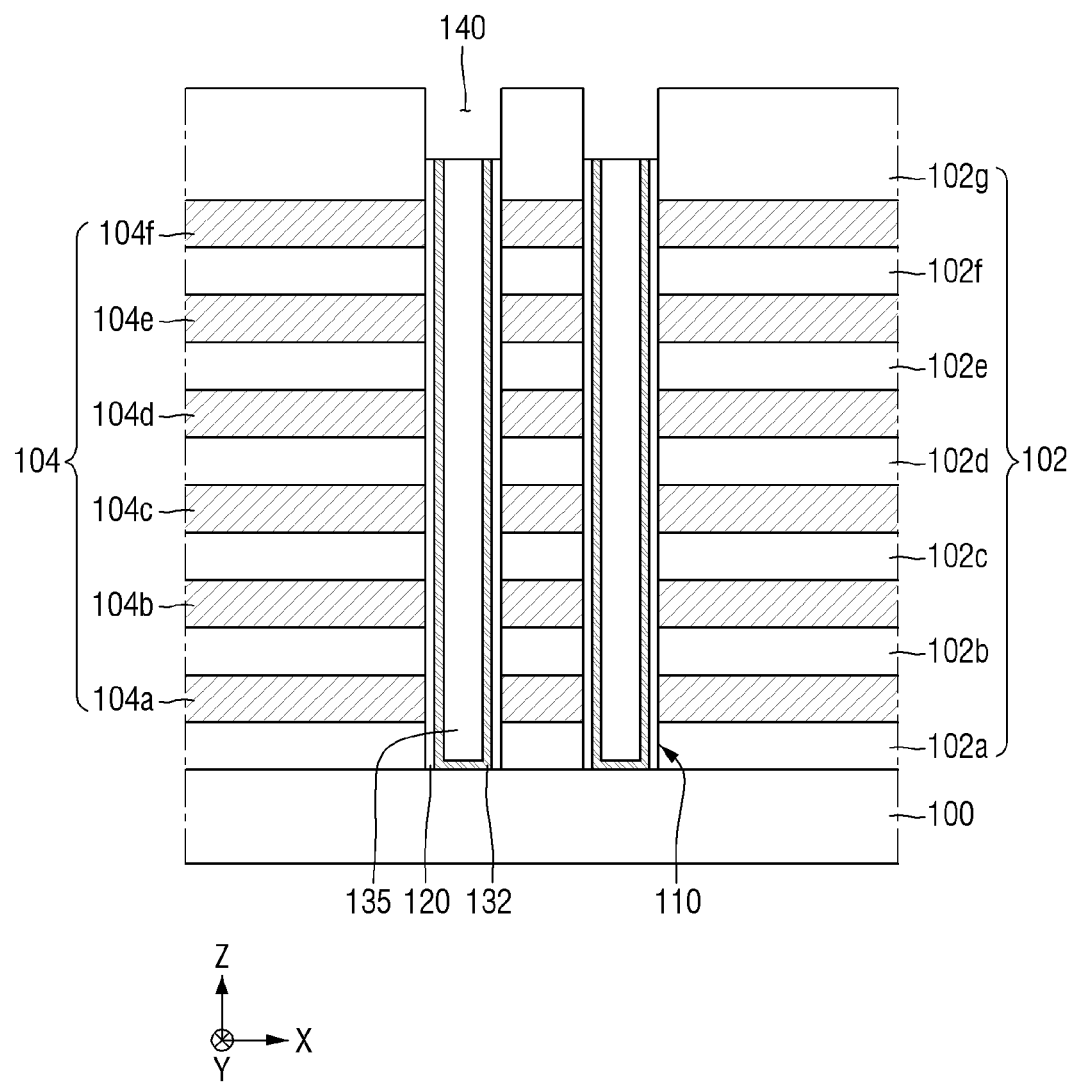
Figure 34:
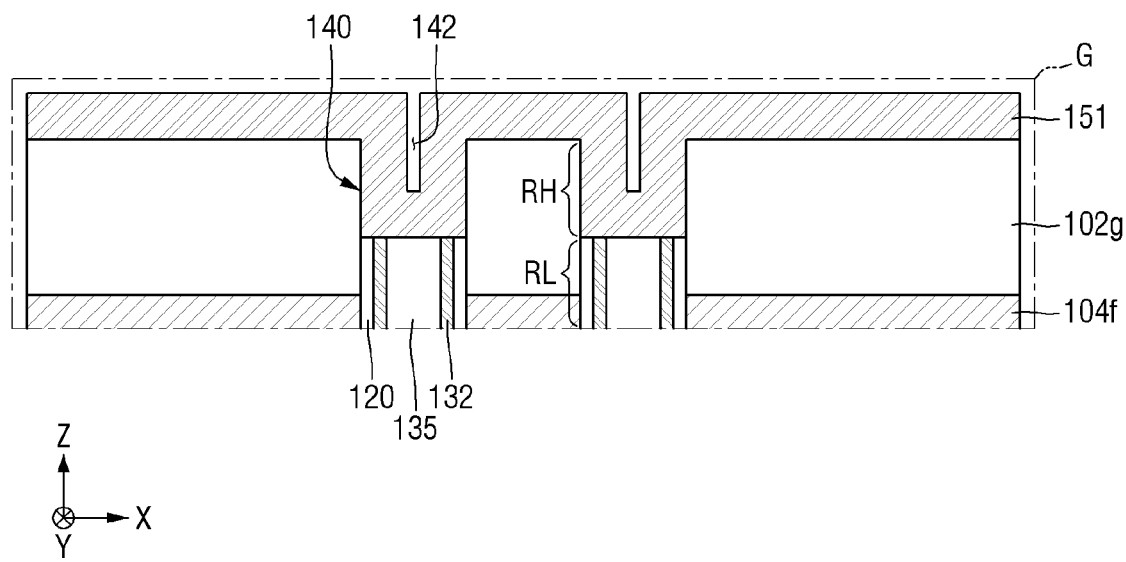
FIGS. 34 to 39 are cross-sectional views for illustrating processing steps of a method for fabricating a semiconductor device according to some exemplary embodiments of the present inventive concept.

Referring to FIG. 34, a spacer layer 151 may be formed on the resulting structure of FIG. 17.

The spacer layer 151 may be formed along the upper surface of the uppermost interlayer insulating layer 102g and the side walls and the lower surface of the second recess 140. Since the spacer layer 151 is formed conformally in the second recess 140, a third recess 142 may be formed therein.

The spacer layer 151 may include a material having an etching selectivity with respect to the filling layer 135. Accordingly, the spacer layer 151 need not be completely etched during a subsequent process of etching of the filling layer 135.

For example, the spacer layer 150 may include a metal or the SOH. However, it is merely illustrative.

Figure 35:
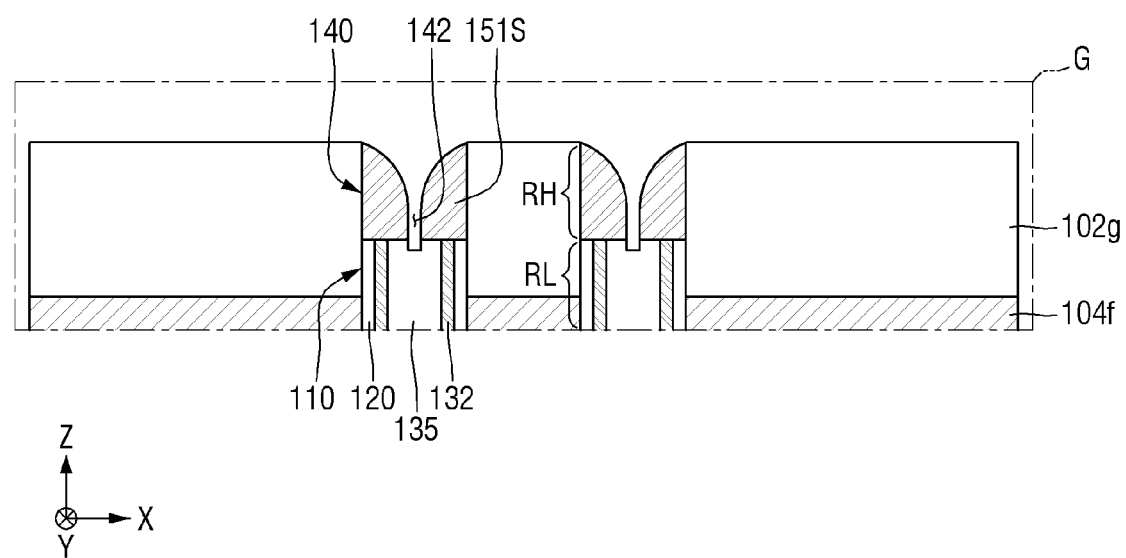

Subsequently, referring to FIG. 35, a spacer 151S and a third recess are formed from the spacer layer 151.

The spacer 151S may be formed by etching the spacer layer 151. In the formation of the spacer 151S, the third recess 142 may become deeper by the dry etching. The spacer 151S may include a bottom hole exposing the filling layer 135. The bottom hole may be connected to the third recess 142 and exposing the filling layer 135.

Figure 36:
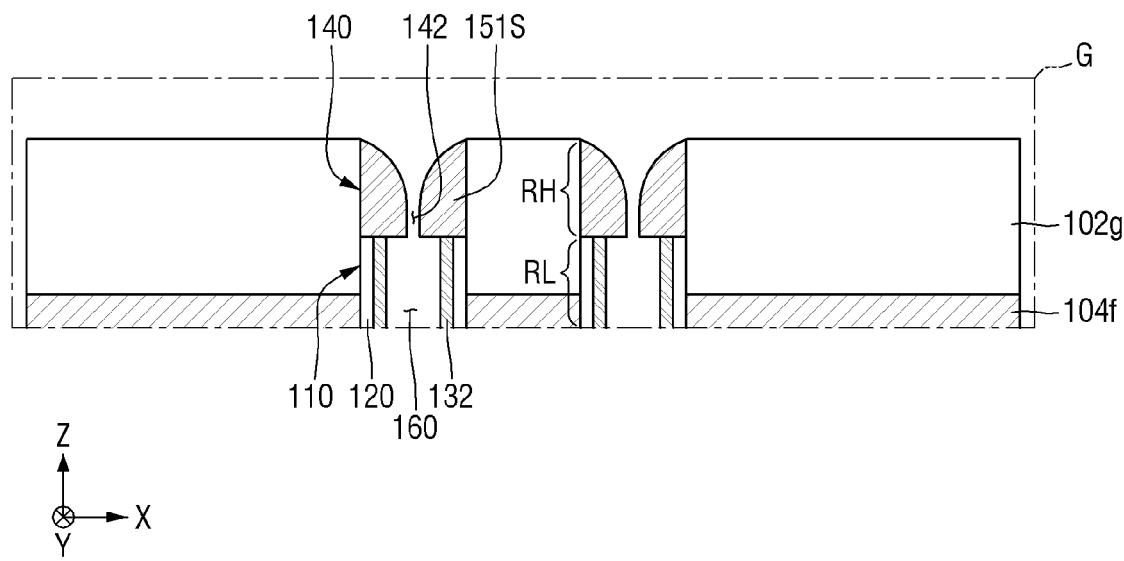

Subsequently, referring to FIG. 36, the filling layer 135 may be completely removed via the third recess 142, that is, the bottom hole.

Since the spacer 151S has an etch selectivity with respect to the filling layer 135, the spacer 151S need not be removed.

The filling layer 135 may be removed via the third recess 142 to form the air gap 160.

Figure 37:
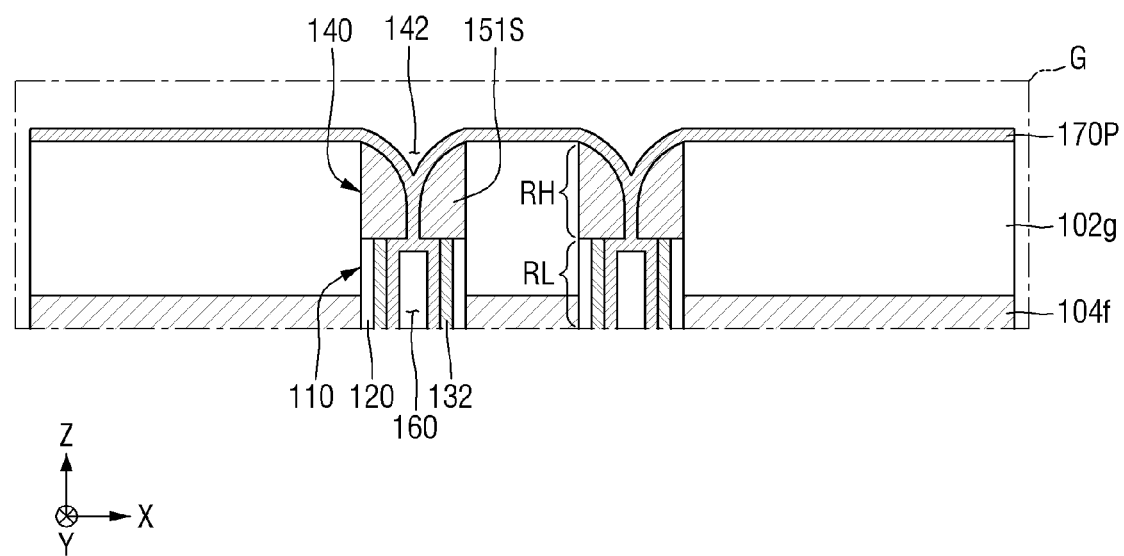

Subsequently, referring to FIG. 37, a preliminary passivation layer 170P is formed.

The preliminary passivation layer 170P may be formed along the upper surface of the uppermost interlayer insulating layer 102g, the side surface and the lower surface of the spacer 150S, and the inner side surface of the channel layer 132. The air gap 160 can be completely sealed by the preliminary passivation layer 170P. In addition, the lower region RL and the upper region RH of each of the channel holes 110 may be separated from each other by the preliminary passivation layer 170P.

The preliminary passivation layer 170P may partially fill the third recess 142 to fill the bottom hole exposed by the spacer 150S. The third recess 142 may be separated from the air gap 160 by the preliminary passivation layer 170P.

In the high region RH, the preliminary passivation layer 170P may be formed along the surface of the spacer 151S to have the Y-shaped vertical cross section.

Figure 38:
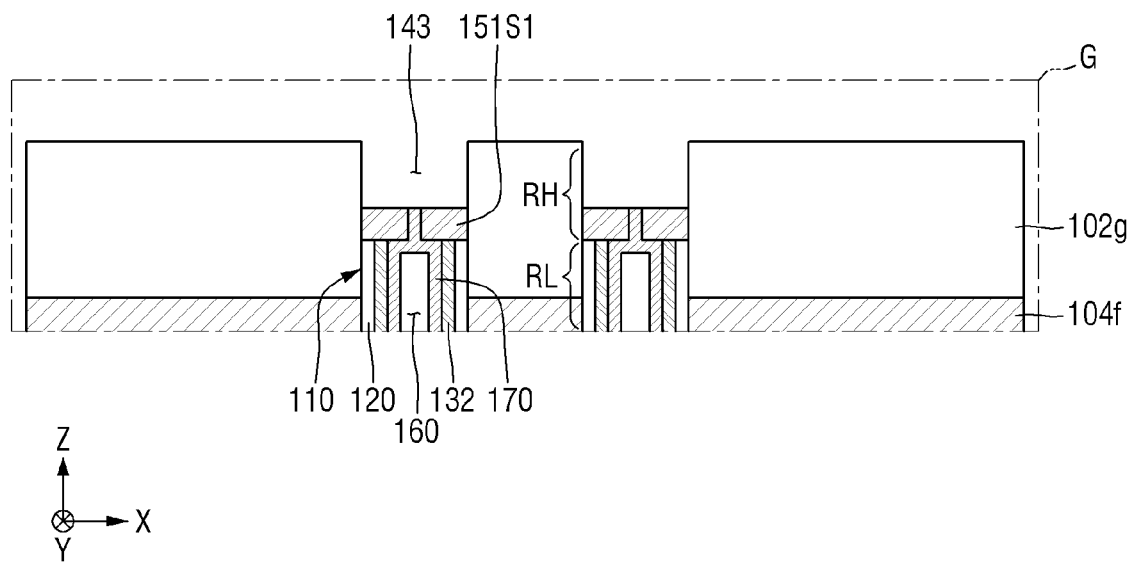

Subsequently, referring to FIG. 38, a part of the spacer 151S and a part of the preliminary passivation layer 170P may be removed.

After the part of the spacer 151S and the part of the preliminary passivation layer 170P are removed, the first recess 143 may be formed. In addition, after the part of the spacer 151S and the part of the preliminary passivation layer 170P are removed, the protrusion 170c of the passivation layer 170 of FIG. 5 may be formed. In addition, as the part of the spacer 151S is removed, the first pad 151S1 may be formed.

Figure 39:
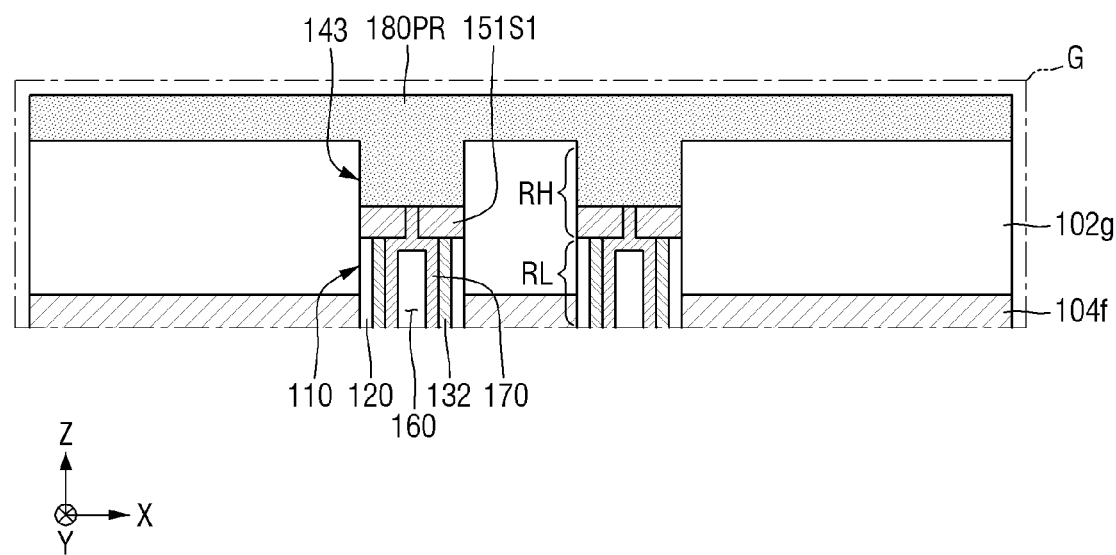

Subsequently, referring to FIG. 39, a preliminary pad layer 180PR may fill the first recess 143. The preliminary pad layer 180PR may be formed on the upper surface of the uppermost interlayer insulating layer 102g.

The preliminary pad layer 180PR may include different materials from the first pad 151S1. The preliminary pad layer 180PR may become the second pad 180P later. The preliminary pad layer 180PR may include, for example, polysilicon.

The first pad 151S1 may be in contact with the channel layer 132. The material of the first pad 151S1 may affect the resistance between the pad 185 and the channel layer 132. For example, the resistance between the second pad 180P and the channel layer 132 may be reduced by selecting a material having a small resistance as the material of the first pad 151S1. The first pad 151S1, unlike the second pad 180P, may include a stress-resistant material to enhance the durability of the vertical semiconductor structure.

As a result, the semiconductor device according to this exemplary embodiment of the present inventive concept may improve the operation speed, durability and performance.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device comprising:
    forming a channel hole penetrating a molded structure formed on a substrate;
    forming a preliminary channel layer on a side surface of the channel hole;
    forming a preliminary filling layer on the preliminary channel layer to fill the channel hole;
    forming a first recess in the channel hole by removing a part of each of the preliminary channel layer and the preliminary filling layer, wherein a channel layer and a filling layer are formed by the forming of the first recess;
    forming a spacer on a side surface of the first recess, the spacer having a bottom hole exposing an upper surface of the filling layer;
    removing the filling layer completely via the bottom hole;
    forming a preliminary passivation layer to fill the bottom hole;
    forming a second recess by removing a part of the preliminary passivation layer and a part of the spacer; and
    forming a pad to fill the second recess.

2. The method of claim 1,
    wherein the forming of the spacer comprises:
    forming a spacer layer to cover the side surface and a bottom surface of the first recess, and
    etching the spacer layer to form the spacer.

3. The method of claim 1,
    wherein a width of the bottom hole is smaller than a width of the preliminary filling layer.

4. The method of claim 1,
    wherein the preliminary passivation layer is formed along a surface of the spacer and a surface of the channel layer.

5. The method of claim 1,
    wherein the forming of the preliminary passivation layer comprises:
    forming an air gap surrounded by the preliminary passivation layer.

6. The method of claim 1,
    wherein the pad and the spacer have a same material.

7. The method of claim 1,
    wherein the forming of the molded structure comprises:
    alternately stacking a plurality of interlayer insulating layers and a plurality of sacrificial layers on the substrate.

8. The method of claim 7, further comprising:
    forming a trench exposing side surfaces of the sacrificial layers and the interlayer insulating layers; and
    replacing the sacrificial layers with conductive layer patterns via the trench.

9. The method of claim 8, further comprising:
    forming a bit line on the pad.

10. A method of fabricating a semiconductor device comprising:
    forming a channel hole penetrating a molded structure formed on a substrate;
    forming a preliminary channel layer on a side surface of the channel hole;
    forming a preliminary filling layer on the preliminary channel layer to fill the channel hole;
    forming a first recess in the channel hole by removing a part of each of the preliminary channel layer and the preliminary filling layer, wherein a channel layer and a filling layer are formed by the forming of the first recess;
    forming a spacer on a side surface of the first recess, the spacer having a bottom hole exposing an upper surface of the filling layer;
    removing the filling layer completely via the bottom hole; and
    forming a preliminary passivation layer in the bottom hole and the channel hole, wherein an air gap is formed to be surrounded by the preliminary passivation layer in the channel hole.

11. The method of claim 10, further comprising:
    after forming a preliminary passivation layer,
    forming a second recess by removing a part of the preliminary passivation layer and a part of the spacer, wherein a passivation layer is formed in the channel layer and the bottom hole; and
    forming a pad to fill the second recess.

12. The method of claim 11,
    wherein the pad and the spacer have a same material.

13. The method of claim 10,
    wherein the forming of the spacer comprises:
    forming a spacer layer to cover the side surface and a bottom surface of the first recess, and
    etching the spacer layer to form the spacer.

14. The method of claim 10,
    wherein the preliminary passivation layer is formed along a surface of the spacer and a surface of the channel layer.

* * * * *